(12) United States Patent
Sasaki et al.

(10) Patent No.: US 8,419,967 B2
(45) Date of Patent: Apr. 16, 2013

(54) PEROVSKITE OXIDE, OXIDE COMPOSITION, OXIDE BODY, PIEZOELECTRIC DEVICE, AND LIQUID DISCHARGE APPARATUS

(75) Inventors: Tsutomu Sasaki, Ashigarakami-gun (JP); Yukio Sakashita, Ashigarakami-gun (JP); Hiroyuki Kobayashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 581 days.

(21) Appl. No.: 12/504,498

(22) Filed: Jul. 16, 2009

(65) Prior Publication Data

US 2011/0006243 A1 Jan. 13, 2011

(30) Foreign Application Priority Data

Jul. 17, 2008 (JP) .................. 2008-185602

(51) Int. Cl.
*C04B 35/26* (2006.01)
*H01L 41/04* (2006.01)

(52) U.S. Cl.
USPC ...... 252/62.9 R; 510/134; 510/135; 510/126; 423/594.1; 423/594.2; 347/68; 310/311; 310/364

(58) Field of Classification Search .................. 501/134, 501/135, 126; 423/594.1, 594.2; 252/62.9 R, 252/62.9 PZ; 310/311, 364; 347/68
See application file for complete search history.

(56) References Cited

U.S. PATENT DOCUMENTS

| | | |
|---|---|---|
| 2006/0279178 A1 | 12/2006 | Ren |
| 2007/0241642 A1 | 10/2007 | Miyazawa et al. |
| 2008/0074471 A1 | 3/2008 | Sakashita et al. |
| 2010/0103226 A1 | 4/2010 | Sakashita et al. |
| 2011/0216132 A1 | 9/2011 | Sakashita et al. |

FOREIGN PATENT DOCUMENTS

| | | |
|---|---|---|
| EP | 1 901 361 A2 | 3/2008 |
| JP | 2000-128632 * | 5/2000 |
| JP | 2000-326506 A | 11/2000 |
| JP | 2007-287745 A | 11/2007 |
| JP | 2008-4782 | 1/2008 |
| JP | 2008-94707 | 4/2008 |
| WO | WO-2007/034903 A1 | 3/2007 |
| WO | WO 2008/088086 A1 | 7/2008 |

OTHER PUBLICATIONS

Derwent citation 2008-M51248 for CN10121813, Chainese patent published Jul. 2008.*
Wang et al, "Enhanced ferroelectricity in Ti-doped multiferroic BiFeO3 thin films", App. Phy. Lett., 89, Aug. 2006, pp. 052903-1 to 052903-3.*
Hongri et al, Substantially enhanced ferroelectricity in Ti doped BiFeO3 films, Jour. Phys. D: appl. Phys., 40, Nov. 2007, 7530-7533.*
J. Zylberberg et al., "Bismuth Aluminate BiAlO$_3$: A New Lead-free High T$_c$ Piezo-/ferroelectric", ISAF 2007 proceedings, 28PS-B13.
Yao Wang et al., "Enhanced ferroelectricity in Ti-doped multiferroic BiFeO$_3$ thin films", Applied Physics Letters, vol. 89, pp. 052903-1-052903-3, 2006.
Liu Hongri et al., "Substantially enhanced ferroelectricity in Ti doped BiFeO$_3$ films", J. Phys. D: Appl. Phys, vol. 40, pp. 7530-7533, 2007.
Morihiro Okada et al., "Synthesis of Bi(Fe$_x$Al$_{1-x}$)O$_3$ Thin Films by Pulsed Laser Deposition and Its Structural Characterization", Japanese Journal of Applied Physics, vol. 43, No. 9B, pp. 6609-6612, 2004.
Shintaro Yasui et al., "Crystal Structure Analysis of Epitaxial BiFeO$_3$-BiCoO$_3$ Solid Solution Films Grown by Metalorganic Chemical Vapor Deposition", Japanese Journal of Applied Physics, vol. 46, No. 10B, pp. 6948-6951, 2007.
Seung-Eek Park et al., "Ultrahigh strain and piezoelectric behavior in relaxor based ferroelectric single crystals", J. Appl. Phys. vo. 82, No. 4, pp. 1804-1811, Aug. 15, 1997.
EP Extended Search Report issued in corresponding European Patent Application No. 09009289.1 on Nov. 7, 2012.
JP Office Action issued in corresponding JP Application No. 2009-162375 on Feb. 12, 2013.

* cited by examiner

*Primary Examiner* — Carol M Koslow
(74) *Attorney, Agent, or Firm* — Birch, Stewart, Kolasch & Birch, LLP

(57) ABSTRACT

A perovskite oxide represented by a general expression,

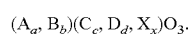

$(A_a, B_b)(C_c, D_d, X_x)O_3$.

(where, A: an A-site element, A=Bi, 0<a, B: one or more types of A-site elements, 0≦b<1.0, C: an B-site element, C= Fe, 0 <c<1.0, D: one or more types of B-site elements, 0≦d<1.0, 0<b+d, X: one or more types of B-site elements, the average valence of which is greater than the average valence of C and D in chemical formula, 0<x<1.0, (average valence of A-site in chemical formula) +(average valence of B-site in chemical formula)>6.0, O: oxygen, and standard molar ratio among A-site elements, B-site elements, and oxygen is 1:1:3, but it may deviate from the standard within a range in which a perovskite structure is possible.)

22 Claims, 8 Drawing Sheets

PEROVSKITE OXIDE, OXIDE COMPOSITION, OXIDE BODY, PIEZOELECTRIC DEVICE, AND LIQUID DISCHARGE APPARATUS

BACKGROUND OF THE INVENTION

1. Field of the Invention

The present invention relates to a perovskite oxide of novel composition with A-site including Bi and B-site including Fe. The invention also relates to an oxide composition, oxide body, piezoelectric element, and liquid discharge apparatus using the same.

2. Description of the Related Art

Provskite oxides having ferroelectricity are used in various applications, such as piezoelectric elements, switching elements, and the like. For example, as a perovskite oxide having a good piezoelectric property, lead zirconate titanate (PZT) is known. PZT is a ferroelectric body having spontaneous polarization in the absence of electric field, and said to show a high piezoelectric performance at and near a morphotropic phase boundary (MPB). If environmental burden is considered, it is preferable that Pb content is reduced as much as possible and a non-lead system that does not include Pb is more preferable. In non-lead perovskite oxides, development of new materials showing a higher piezoelectric performance has been in progress.

In developing new non-lead system materials, it is noteworthy that some of the perovskite oxides presumably having high characteristics in theory can be turned into perovskite oxides by sintering under a high pressure exceeding several GPa, although they can not take a perovskite crystal structure by high-temperature sintering under normal pressure. For example, Bi-system perovskite oxides are considered in theory to be non-lead system piezoelectric materials having a high piezoelectric property (ferroelectric property), but most of them hardly, some of them can not, take a perovskite-type structure by high-temperature sintering under normal pressure.

Currently, in bulk ceramics, only $BiFeO_3$ can be manufactured into a Bi-system perovskite oxide under normal pressure. For example, it is reported that $BiAlO_3$ can be turned into a bulk ceramic only by a high-temperature and high-pressure synthesis of 6 GPa with 1000° C in a literature by J. Zylberberg et al., "Bismuth Aluminate $BiAlO_3$: A New Lead-free High-$T_c$ Piezo-/ferroelectric", ISAF 2007 proceedings, 28PS-B13 (Non-Patent Document 1). Sintering under a high pressure, however, requires a complicated system and the process is not straightforward.

In the mean time, device downsizing has been underway in the trend toward high density and high integration of devices. Also, in the field of piezoelectric elements, thickness reduction of elements has been moved forward, and perovskite oxide films capable of providing favorable element property have been studied for that purpose.

$BiFeO_3$ has been studied for the application to ferroelectric memory (FeRAM) or piezoelectric actuator because it has an excellent ferroelectricity. $BiFeO_3$ is also a magnetic body and has been drawing attention as a multiferroic material. Ti doped $BiFeO_3$ is reported in a literature by Y. Wang and C. W. Nan, "Enhanced ferroelectricity in Ti-doped multiferroic $BiFeO_3$ thin films", APPLIED PHYSICS LETTERS, Vol. 89, pp. 052903-1-052903-3, 2006 (Non-Patent Document 2) and in a literature by L. Hongri and S. Yuxia, "Substantially enhanced ferroelectricity in Ti doped $BiFeO_3$ films", J. Phys. D, Appl. Phys., Vol. 40, pp. 7530-7533, 2007 (Non-Patent Document 3).

It has been attempted to produce a perovskite-type crystal structure in a Bi system oxide that can not take a perovskite-type crystal structure unless sintered under a high pressure by mixing it with $BiFeO_3$ that takes a perovskite-type crystal structure relatively easily at bulk sintering under normal pressure and in film state to form a solid solution. A Bi (Fe, Al)$O_3$ film of perovskite structure, in which 0 to 50 mol % of $BiAlO_3$ is solidified with $BiFeO_3$ on a $SrTiO_3$ substrate, is reported in a literature by M. Okada et al., "Synthesis of Bi (Fe$_x$Al$_{1-x}$)O$_3$ 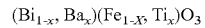 Thin Films by Pulsed Laser Deposition and Its Structural Characterization", Japanese Journal of Applied Physics, Vol. 43, No. 9B, pp. 6609-6612, 2004 (Non-Patent Document 4). Further, a Bi(Fe, Co)$O_3$ film of perovskite structure, in which 0 to 33 mol % of $BiCoO_3$ is solidified with $BiFeO_3$ on a $SrTiO_3$ substrate, is reported in a literature by S. Yasui et al., "Crystal Structure Analysis of Epitaxial $BiFeO_3$—$BiCoO_3$ Solid Solution Films Grown by Metal organic Chemical Vapor Deposition", Japanese Journal of Applied Physics, Vol. 46, No. 10B, pp. 6948-6951, 2007 (Non-Patent Document 5).

As a non-lead perovskite oxide, barium titanate ($BaTiO_3$) is known. Japanese Unexamined Patent Publication No. 2007-287745 (Patent Document 1) discloses a perovskite oxide in which $BiFeO_3$ is solidified with $BaTiO_3$. The perovskite oxide described in Patent Document 1 is represented by the expression below.

$$(Bi_{1-x}, Ba_x)(Fe_{1-x}, Ti_x)O_3$$

where, $0<x<1$, and in Examples, the film forming is performed within the range, $0.05 \leq x \leq 0.60$ (claim 1 and Paragraph 0060 in Patent Document 1).

The present invention has been developed in view of the circumstances described above, and it is an object of the present invention to provide, in a system with A-site including Bi and B-site including Fe, a perovskite oxide of novel composition with an excellent ferroelectric performance (piezoelectric performance).

SUMMARY OF THE INVENTION

An perovskite oxide of the present invention is a perovskite oxide represented by a general expression (P) below, $$(A_a, B_b)(C_c, D_d, X_x)O_3 \qquad (P).$$

(where, conditions of reference symbols and the like are as follows:

A: an A-site element, A=Bi, $0<a$,
B: one or more types of A-site elements, $0 \leq b < 1.0$,
C: an B-site element, C=Fe, $0<c<1.0$,
D: one or more types of B-site elements, $0 \leq d < 1.0$,
$0<b+d$,
X: one or more types of B-site elements, the average valence of which is greater than the average valence of C and D in chemical formula, $0<x<1.0$,
(average valence of A-site in chemical formula)+(average valence of B-site in chemical formula)>6.0,
O: oxygen, and
standard molar ratio among A-site elements, B-site elements, and oxygen is 1:1:3, but the molar ratio may deviate from the standard within a range in which a perovskite structure is possible.)

In a preferable form of the perovskite oxide of the present invention: $d>0$ and D includes at least one type of element selected from the group consisting of Al, Co, Sc, Ga, Y, In, Mn, Zn, Cr, and Ni; and X includes at least one type of element selected from the group consisting of Si, Ti, Mn, Zr, Ge, Nb, W, Mo, Ta, Hf, and Sn.

In another preferable form of the perovskite oxide of the present invention: b>0 and B includes at least one type of element selected from the group consisting of K, Ba, Sn, and a lanthanide element; and X includes at least one type of element selected from the group consisting of Si, Ti, Mn, Zr, Ge, Nb, W, Mo, Ta, Hf, and Sn.

In still another preferable form of the perovskite oxide of the present invention: b>0 and d>0;

B includes at least one type of element selected from the group consisting of K, Ba, Sn, and a lanthanide element;

D includes at least one type of element selected from the group consisting of Al, Co, Sc, Ga, Y, In, Mn, Zn, Cr, and Ni; and X includes at least one type of element selected from the group consisting of Si, Ti, Mn, Zr, Ge, Nb, W, Mo, Ta, Hf, and Sn.

A preferable form of the present invention may be a perovskite oxide in which d>0 and D includes at least one type of element selected from the group consisting of Al, Co, and Zn, and X includes at least one type of element selected from the group consisting of Si, Ti, Mn, Nb, and Zr.

Another preferable form of the present invention may be a perovskite oxide in which b>0 and B includes the lanthanide element, and X includes at least one type of element selected from the group consisting of Si, Ti, Mn and Nb. Preferably, in the perovskite oxide, B includes at least one type of element selected from the group consisting of Sm, Nd, La, and Dy.

A further preferable form of the present invention may be a perovskite oxide in which b>0 and B includes Ba and/or Sn, and X includes at least one type of element selected from the group consisting of Si, Ti, Mn, and Nb.

Another preferable form of the present invention may be a perovskite oxide represented by formula below.

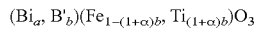

(where, B' represents Ba and/or Sn, $0 < \alpha \leq 0.15$)

Still another preferable form of the present invention may be a perovskite oxide in which b>0 and B includes K, and X includes at least one type of element selected from the group consisting of Si, Ti, Mn, and Nb.

According to the present invention, a perovskite oxide having a composition of or near a morphotropic phase boundary (MPB) is provided. The term "near MPB" as used herein refers to an area which transforms into another phase when an electric field is applied.

An oxide composition of the present invention is a composition that includes the perovskite oxide described above.

An oxide body of the present invention is a body including the perovskite oxide described above. The oxide body may be in the form of a film or a bulk ceramic body.

According to the present invention, an oxide body that shows a piezoelectric performance may be provided. Preferably, the oxide body showing a piezoelectric performance includes a ferroelectric phase having crystal orientation.

The term "having crystal orientation" as used herein is defined as having an orientation factor F not less than 80% measured by Lotgering method. The orientation factor F is represented by formula (i) below.

$$F(\%) = (P - P0)/(1 - P0) \times 100 \quad (i)$$

where, P is the ratio between the sum of reflection intensities and the sum of total reflection intensities from the oriented face. Where (001) orientation, P is the ratio between the sum ΣI (001) of reflection intensities I (001) from the (001) face and the sum ΣI (hk1) of reflection intensities I (hk1) from each crystal face (hk1), that is, ΣI(001)/ΣI(hk1). For example, in a perovskite crystal, if the orientation is (001), P=I(001)/[I(001)+I(100)+I(101)+I(110)+I(111)]. P0 corresponds to P of a sample having perfect random orientation. In perfect random orientation (P=P0), F=0%, while in perfect orientation (P=1), F=100%.

Preferably, the oxide body showing a piezoelectric performance includes a ferroelectric phase having crystal orientation in a direction different from a spontaneous polarization axis direction of the ferroelectric phase. Preferably, the ferroelectric phase is at least one ferroelectric phase selected from the group consisting of a rhombohedral phase having crystal orientation substantially in <100> direction, a rhombohedral phase having crystal orientation substantially in <110> direction, a tetragonal phase having crystal orientation substantially in <110> direction, a tetragonal phase having crystal orientation substantially in <111> direction, an orthorhombic phase having crystal orientation substantially in <100> direction, and an orthorhombic phase having crystal orientation substantially in <111> direction. The term "having crystal orientation substantially in <abc> direction" as used herein is defined as that the orientation factor F in the direction is not less than 80%.

Preferably, the ferroelectric phase having crystal orientation in a direction different from a spontaneous polarization axis direction of the ferroelectric phase has a property to transform at least in part, when an electric field is applied in a direction different from the spontaneous polarization axis direction of the ferroelectric phase, into another ferroelectric phase of different crystal system.

A piezoelectric device of the present invention is a device that includes the oxide body showing a piezoelectric performance of the present invention and electrodes for applying an electric field to the oxide body. A liquid discharge apparatus of the present invention is an apparatus that includes the piezoelectric device of the present invention and a liquid discharge member provided adjacent to the piezoelectric device, the liquid discharge member having a liquid storage chamber for storing a liquid and a liquid discharge opening for discharging the liquid from the liquid storage chamber to the outside according to the application of the electric field to the oxide body.

According to the present invention, in a system in which A-site includes Bi and B-site includes Fe, a perovskite oxide of novel composition with an excellent ferroelectric performance (piezoelectric performance) may be provided.

DESCRIPTION OF THE PREFERRED EMBODIMENTS

[Perovskite Oxide]

A perovskite oxide of the present invention is characterized in that it is represented by a general expression (P) below, $$(A_a, B_b)(C_c, D_d, X_x)O_3 \quad (P).$$

(where, conditions of reference symbols and the like are as follows:
A: an A-site element, A=Bi, 0<a,
B: one or more types of A-site elements, 0≦b<1.0,
C: a B-site element, C=Fe, 0<c<1.0,
D: one or more types of B-site elements, 0≦d<1.0, 0<b+d,
X: one or more types of B-site elements, average valence of which is greater than average valence of C and D in chemical formula, 0<x<1.0,
(average valence of A-site in chemical formula)+(average valence of B-site in chemical formula)>6.0,
O: oxygen, and
The standard molar ratio among A-site elements, B-site elements, and oxygen is 1:1:3, but these values may deviate from those in the standard molar ratio within a range in which a perovskite structure is possible.)

In the perovskite oxide of the present invention, A-site may or may not include metal element B other than Bi, and B-site may or may not include metal element D other than Fe. But, at least either one of metal element B and metal element D is essential. That is, the perovskite oxide of the present invention is a plural component system in which at least one type of perovskite oxide selected from a group consisting of $BiDO_3$, $BFeO_3$, and $BDO_3$ is solidified with $BiFeO_3$, and further doped with metal element X as a donor.

By solidifying $BiFeO_3$ with an oxide that can become a perovskite oxide with an excellent ferroelectric performance (piezoelectric performance) in theory, a perovskite oxide of novel composition with an excellent ferroelectric performance (piezoelectric performance) may be provided.

Basically, the present invention is directed to a non-lead system in which A-site does not include Pb, but A-site element B may include Pb. Where A-site element B includes Pb, the Pb content may be reduced to a smaller value in comparison with lead systems, such as PZT. Accordingly, the perovskite oxide of the present invention is an eco-friendly material. There is not a specific limitation on Bi content "a" in A-site, but it is preferable to be, a≧0.8.

There is not a specific limitation on the phase structure of the perovskite oxide of the present invention. Thus, it may take a mixed crystal structure of 2 to 4 phases in which a plurality of perovskite oxide components coexists, a single phase structure in which a plurality of perovskite oxide components is completely solidified into a single phase, or other structures.

Figure 5:
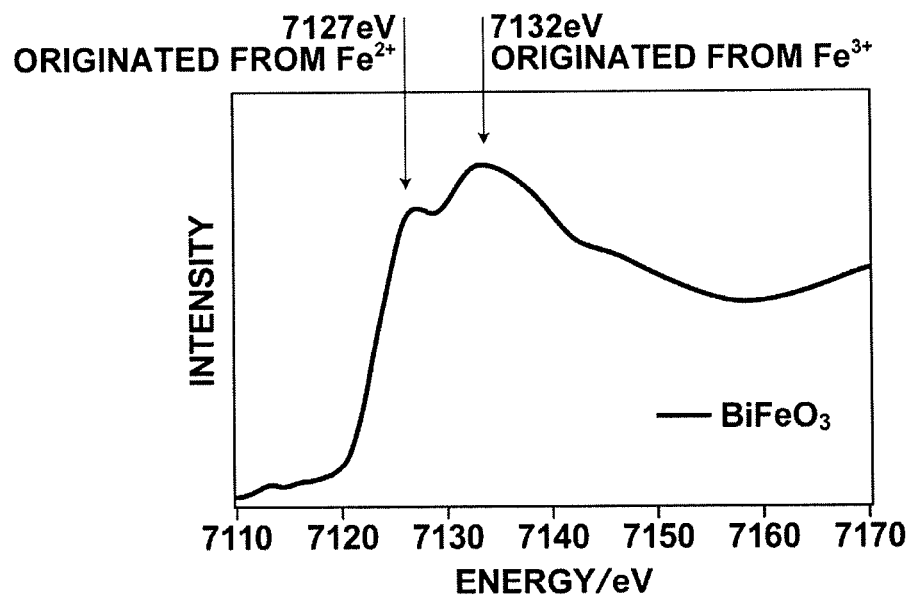
FIG. 5 shows an XANES spectrum of Comparative Example 1.

In one component system of $BiFeO_3$, it is known that the valence of Fe, which is trivalence in chemical formula, is likely to change and a part of Fe is present with bivalence (FIG. 5 of Non-Patent Document 2 cited under "Description of the Related Art"). The inventors of the present invention have also confirmed such fact in Comparative Example 1 to be described later.

In $BiFeO_3$, the valence transition described above causes oxygen vacancies corresponding to bivalence Fe which gives rise to a problem of leakage current. In Non-Patent Documents 2 and 3, leakage current is suppressed by donor doping Ti having a greater valence number than that of Fe and compensating for the electrons generated by the valence transition of Fe. In Non-Patent Documents 2 and 3, a $BiFeO_3$ film doped with 5 or 10 mol % of Ti is formed in B-site. The Ti doped $BiFeO_3$ film may suppress more leakage current than Ti non-doped $BiFeO_3$ and provide a higher ferroelectric performance (FIG. 3 in Non-Patent Document 2, FIGS. 3 and 4 in Non-Patent Document 3).

The inventors of the present invention have found out that the valence transition of Fe could also occur in a plural component system of $BiFeO_3$ with another component solidified thereto. In a plural component system of $BiFeO_3$, which is likely to cause leakage current, with another component solidified thereto, the present invention is a system in which $BiFeO_3$ is doped with donor X having an average valence greater than that of B-site elements C and D in order to compensate for valence transition of Fe, and such composition design is novel.

The term "leakage current is likely to occur" as used herein is defined as (1) when dielectricity is not verified in bipolar polarization-electric field hysteresis measurements under the conditions of: measurement temperature=room temperature; measurement frequency=5 Hz, and application voltage E=200 kV/cm, or (2) a leakage current of 5 to 10A is measured in leakage current measurement (I-V measurement) with an application voltage of 200 kV/cm.

As will be described below, in the present invention, a novel composition design is employed which is neither described nor suggested in the documents cited under, "Description of the Related Art".

A-site elements, such as Bi, Pb, and the like, are highly volatile, and systems that include such elements are likely to have an A-site defect. Further, when such A-site elements evaporate, it is often the case that they evaporate in the form of oxides, so that oxygen vacancies are also likely to occur at the same time. In the system of the present invention, donor X can compensate for an A-site defect and valence transition caused by an oxygen vacancy due to the A-site defect, whereby property degradation may be prevented.

The inventors of the present invention have also found out a problem that any known Bi system perovskite oxide, such as $BiFeO_3$ or $BiAlO_3$, has a high coercive electric field. The inventors of the present invention have found out that, in a plural component system of $BiFeO_3$ with another component solidified thereto, an advantageous effect of decreasing the coercive electric field Ec can be obtained by doping donor X. The exact reason for this is not clear, but may be thought that a domain wall which has been pinned by an oxygen vacancy becomes mobile by charge compensation of donor doping. The decrease in coercive electric field Ec allows piezoelectric performance to appear from a lower electric field, leading to a higher piezoelectric property.

It is said that any known perovskite oxide, such as PZT, shows a high piezoelectric performance at and near a morphotropic phase boundary (MPB). Hereinafter, it will be sometimes denoted simply as "MPB composition", in which case it refers to MPB composition and its adjacent composition.

Although, the present invention is not limited to MPB composition, but MPB composition is preferable since a higher piezoelectric performance can be expected.

There is not a specific limitation on the phase structure the perovskite oxide of the present invention. Preferably, the perovskite oxide of the present invention, in piezoelectric application, takes a mixed crystal structure of a plurality of phases in which a plurality of perovskite oxide components coexists, and has at least two types of crystal systems. Since the most stable crystal system of $BiFeO_3$ is a rhombohedral, it is preferable that another type of perovskite oxide to be solidified with $BiFeO_3$ has a crystal system other than a rhombohedral (e.g., tetragon) as the most stable crystal system. Such mixed crystal structure allows the perovskite oxide to have the MPB or its adjacent composition and a high piezoelectric performance can be expected.

The MPB composition can be designed from the relationship of ion radii between A-site and B-site metal elements. The inventors of the present invention have filed an application for patent (Patent Application No. 2007-010185, currently published as Japanese Unexamined Patent Application Publication No. JP-A-2008-195603) related to a MBP composition design of a non-lead perovskite oxide with A-site mainly consisting of Bi. For MPB composition design, refer to this document. In the present invention, the relationship of ion radii described above can be controlled by doping donor X, which provides a high degree of flexibility in composition design and allows designing of a novel MPB composition. This will lead to the creation of novel materials with remarkable performances, including piezoelectric performance and the like.

In a preferable form of the perovskite oxide (P) of the present invention: d>0 and D includes at least one type of element selected from the group consisting of Al, Co, Sc, Ga, Y, In, Mn, Zn, Cr, and Ni; and X includes at least one type of element selected from the group consisting of Si, Ti, Mn, Zr, Ge, Nb, W, Mo, Ta, Hf, and Sn.

In another preferable form of the perovskite oxide (P) of the present invention: b>0 and B includes at least one type of elements selected from the group consisting of K, Ba, Sn, and a lanthanide element; and X includes at least one type of element selected from the group consisting of Si, Ti, Mn, Zr, Ge, Nb, W, Mo, Ta, Hf, and Sn.

In still another preferable form of the perovskite oxide of the present invention: b>0 and d>0; B includes at least one type of element selected from the group consisting of K, Ba, Sn, and a lanthanide element; D includes at least one type of element selected from the group consisting of Al, Co, Sc, Ga, Y, In, Mn, Zn, Cr, and Ni; and X includes at least one type of element selected from the group consisting of Si, Ti, Mn, Zr, Ge, Nb, W, Mo, Ta, Hf, and Sn.

Where the perovskite oxide of the present invention include both metal element B and metal element D, it is preferable that the composition design is carried out such that the sum of the average valence of metal element B in the chemical formula and the average valence of metal element D in the chemical formula becomes hexavalent and $BDO_3$ takes a perovskite structure.

The perovskite oxide of the present invention may take the following forms, (PX) to (PZ).

<1> $Bi_a(Fe_c, D_d, X_x)O_3$ (where, d>0)  (PX)

<2> $(Bi_a, B_b)(Fe, X_x)O_3$ (where, b>0)  (PY)

<3> $(Bi, B_b)(Fe, D_d, X_x)O_3$ (where, b>0 and d>0)  (PZ)

Hereinafter, each form will be described in detail.

<1> $Bi_a(Fe_c, D_d, X_x)O_3$ (where, d>0)  (PX)

$BiFeO_3$ may take a perovskite structure in bulk sintering under normal pressure, and may also take a perovskite structure in a thin film state easily.

D does not have any limitation if it satisfies the condition of the expression (P) above. Preferably, $BiDO_3$ includes an oxide which can not take or is difficult to take a perovskite structure in normal pressure.

The term "normal pressure" as used herein refers to a pressure close to atmospheric pressure or a pressure within a range common in thin film forming methods. Film forming methods for piezoelectric films are largely grouped into gas phase methods, such as sputtering, pulse laser deposition (PLD), chemical vapor deposition (CVD) and liquid phase methods, such as sol gel method. It is generally understood that a pressure range from about $10^{-4}$ to about $10^3$ Pa ($7.6 \times 10^{-4}$ mTorr to $7.6 \times 10^3$ mTorr) is common in the gas phase methods, and the liquid phase methods are carried out under atmospheric pressure (about $10^5$ Pa (760 Torr)).

The term "can not take or is difficult to take a perovskite structure" as used herein refers to that a sintered body produced by solid phase sintering under normal pressure can not take a perovskite structure or otherwise has a different phase in addition to a perovskite structure. The evaluation of the perovskite structure was performed by X-ray diffraction (XRD). The XRD measurement in the present invention was performed by a common method, i.e., by 2θ/ω scan (θ·2θ) using a standard Cu tube, "Ultima III" (Rigaku Corporation), with a film thickness about 500 nm. The details of which are summarized in Table 1 below.

TABLE 1

| | |
|---|---|
| Goniometer | Ultima III, In-plane |
| Attachment | Thin Film Sample Stage |
| Scanning Mode | 2θ/ω |
| Scanning Type | Continuous Scanning |
| X-Ray | 40 kV/40 mA |
| Attenuator | Open |
| | *Normally open, but 1/10 inserted for excessive intensity |
| Divergence Slit DS | 1.00 mm |
| Scattering Slit SS | Open |
| Receiving Slit RS | Open |
| Vertical Divergence Limiting Slit | 10 mm |
| Incident soller | V5 |
| Receiving Soller | PSA |
| Sampling Step | 0.005 |
| Scan Speed | 4.0°/min |

Metal elements which can not or are difficult to take a perovskite structure with Bi under normal pressure include Al, Co, Sc, Ga, Y, In, Mn, Zn, Cr, Ni, and the like. That is, it is preferable that D includes at least one type of element selected from the group consisting of Al, Co, Sc, Ga, Y, In, Mn, Zn, Cr, and Ni.

Considering that the valence of Bi or Fe in the chemical formula is trivalent, it is preferable that the average valence of D is trivalent. D may include only trivalent elements or may be a combination of elements having smaller and greater valences than trivalence with the average valence of 3, otherwise a combination of elements having smaller and greater valences than trivalence and a trivalent element with the average valence of 3.

Trivalent metal elements which can not or are difficult to take a perovskite structure with Bi under normal pressure include Al, Co, Sc, Ga, Y, In, and the like. Combinations of metal elements having smaller and greater valences than trivalence which can not or are difficult to take a perovskite structure with Bi under normal pressure include combinations of a bivalent metal element and a tetravalent element, such as $(Zn^{2+}_{0.5}Ti^{4+}_{0.5})$, $(Zn^{2+}_{0.5}Zr^{4+}_{0.5})$, $(Zn^{2+}_{0.5}Sn^{4+}_{0.5})$, $(Zn^{2+}_{0.5}Nb^{4+}_{0.5})$, and the like.

In the present invention, the average valence of entire B-site can be controlled by donor X, so that the average valence of D may be deviated from trivalence within a range in which a perovskite structure is possible.

A preferable form of a perovskite oxide (PX) may be that in which D includes at least one type of element selected from the group consisting of Al, Co, and Zn, and X includes at least one type of element selected from the group consisting of Si, Ti, Mn, Nb, and Zr. Specific compositions include $Bi_a(Fe_c, Al_d, Si_x)O_3$, $Bi_a(Fe_c, Co_d, Ti_x)O_3$, $Bi_a(Fe_c, Zn_d, Ti_x)O_3$, $Bi_a(Fe_c, (Al, Sc)_d, Ti_x)O_3$, $Bi_a(Fe_c, Zn_d, (Ti, Si)_x)O_3$, and the like.

By solidifying $BiFeO_3$, which is solely like to take a perovskite structure, with $BDO_3$, which includes an oxide which can not take or is difficult to take a perovskite structure under normal pressure but can, in theory, become a perovskite oxide with an excellent ferroelectric performance (piezoelectric performance), a perovskite oxide of novel composition with an excellent ferroelectric performance (piezoelectric performance) may be provided without requiring a high pressure process.

<2> $(Bi_a, B_b)(Fe, X_x)O_3$ (where, $b>0$)　　(PY)

There is not a specific limitation on A-site element B as long as it is at least one type of metal element different from Bi and takes a perovskite structure with Fe. A-site element B may be at least one type of metal element with the average valence of 3 or at least one type of element with the average valence other than 3.

Preferably, B includes at least one type of element selected from the group consisting of K, Ba, Sn, and a lanthanide element, and X includes at least one type of element selected from the group consisting of Si, Ti, Mn, Zr, Ge, Nb, W, Mo, Ta, Hf, and Sn.

A preferable form of a perovskite oxide (PY) may be that in which B includes a lanthanide element and X includes at least one type of element selected from the group consisting of Si, Ti, Mn, and Nb. In particular, it is preferable that B includes at least one type of element selected from the group consisting of Sm, Nd, La, and Dy, and X includes at least one type of element selected from the group consisting of Si, Ti, Mn, and Nb. Specific compositions include $(Bi_a, Sm_b)(Fe_c, Si_x)O_3$, $(Bi_a, Sm_b)(Fe_c, Ti_x)O_3$, and the like.

A preferable form of a perovskite oxide (PY) may be that in which B includes Ba and/or Sn, and X includes at least one type of element selected from the group consisting of Si, Ti, Mn, and Nb. Specific compositions include $(Bi_a, B'_b)(Fe_c, Si_x)O_3$, $(Bi_a, B'_b)(Fe_c, Ti_x)O_3$, and the like. Here, B' represents Ba and/or Sn.

On first sight, $(Bi_a, Ba_b)(Fe_c, Ti_x)O_3$ looks like the perovskite oxide in composition described in Patent Document 1 cited under "Description of the Related Art". The perovskite oxide described in Patent Document 1 is represented by the formula below.

$(Bi_{1-x}, Ba_x)(Fe_{1-x}, Ti_x)O_3$ (where $0<x<1$),

In an Example described in Patent Document 1, the film forming is performed within a range of $0.05 \leq x \leq 0.60$ (claim 1 and Paragraph 0060 in Patent Document 1).

Ti included in the perovskite oxide described in Patent Document 1, however, is not a donor for compensating for the valence transition of Fe, and differs in function from component X in Formula (P) of the present invention. The oxide described in Patent Document 1 is an oxide with 33 system $BiFeO_3$ solidified with 24 system $BaTiO_3$. In the oxide described in Patent Document 1, the amount of Bi is equal to the amount of Fe, and the amount of Ba is equal to the amount of Ti, and charge neutralization is achieved ((average valence of A-site in chemical formula)+(average valence of B-site in chemical formula)=6.0). In contrast, in the present invention, charge neutralization in the chemical formula is not achieved and (average valence of A-site in chemical formula)+(average valence of B-site in chemical formula)>6.0. Note that, in the present invention, charge neutralization is achieved, in effect, due to valence transition of Fe.

The inventors of the present invention have studied for a desirable composition with respect to $(Bi_a, B'_b)(Fe_c, Ti_x)O_3$, and have found out that the following is desirable.

$(Bi_a, B'_b)(Fe_{1-(1+\alpha)b}, Ti_{(1+\alpha)b})O_3$ where, B' represents Ba and/or Sn, $0 < \alpha \leq 0.15$ The inventors of the present invention have found out that leakage current due to valence transition of Fe can be prevented and a high piezoelectric performance can be obtained within the range described above.

A preferable form of a perovskite oxide (PY) may be that B includes K, and X includes at least one type of element selected from the group consisting of Si, Ti, Mn, and Nb.

<3> $(Bi, B_b)(Fe, D_d, Xx)O_3$ (where, $b>0$ and $d>0$)　　(PZ)

In perovskite oxide (PZ), metal element D is identical to metal element D in perovskite oxide (PX) and metal element B is identical to metal element B in perovskite oxide (PY).

That is, it is preferable that:

B includes at least one type of element selected from the group consisting of K, Ba, Sn, and a lanthanide element;

D includes at least one type of element selected from the group consisting of Al, Co, Sc, Ga, Y, In, Mn, Zn, Cr, and Ni; and X includes at least one type of element selected from the group consisting of Si, Ti, Mn, Zr, Ge, Nb, W, Mo, Ta, Hf, and Sn.

Preferably, B-site element D includes an element which can not take or is difficult to take a perovskite structure with Bi. In this case, A-site element B can be doped in order to make B-site element D, which can not take or is difficult to take a perovskite structure with Bi, take a perovskite structure more easily. In such material design, it is preferable that A-site element B is an element which can not take or is difficult to take a perovskite structure with B-site element Fe. Such metal elements include Sm, La, Nd, Dy, and the like.

That is, it is preferable that:

D includes at least one type of element selected from the group consisting of Al, Co, Sc, Ga, Y, In, Mn, Zn, Cr, and Ni; and B includes at least one type of element selected from the group consisting of Sm, Nd, La, and Dy.

The composition of Perovskite oxides (PX) to (PZ) is not limited to MPB composition, but it is preferable that they have MPB composition since a higher piezoelectric performance can be expected. As described above, the present invention may provide a high degree of flexibility in composition design and allows designing of a novel MPB composition. This will lead to the creation of novel materials with remarkable performances, including piezoelectric performance and the like. Specific MPB design examples in the perovskite oxide of the present invention will now be described.

For example, in the study conducted by the inventors of the present invention, the most stable crystal system of $BiAlO_3$ with B-site element D as Al is presumed to be tetragonal, and MPB composition or its adjacent composition may be obtained by solidifying $BiFeO_3$ and $BiAlO_3$. The inventors of the present invention presume that MPB composition of a solidified system of $BiFeO_3$—$BiCoO_3$, not doped with donor X, is Fe:Al (molar ratio)=0.4:0.6 or its adjacent composition.

The most stable crystal system of $BiCoO_3$ with B-site element D as Co is presumed to be tetragonal, and MPB composition or its adjacent composition may be obtained by solidifying $BiFeO_3$ and $BiCoO_3$. The inventors of the present invention presume that MPB composition of a solidified system of $BiFeO_3$—$BiCoO_3$, not doped with donor X, is Fe:Co (molar ratio)=0.75:0.25 or its adjacent composition.

$BiAlO_3$ or $BiCoO_3$ is essentially an oxide which is difficult to take a perovskite structure with Bi. That is, Bi and Al, or Bi and Co is fundamentally an incompatible combination. The present invention allows a MPB composition design in which the amount of $BiAlO_3$ or $BiCoO_3$, which is an oxide fundamentally difficult to take a perovskite structure with Bi, is reduced through donor X doping. The fact that the amount of $BiAlO_3$ or $BiCoO_3$, which is an oxide fundamentally difficult to take a perovskite structure with Bi, can be reduced means that a perovskite structure is more likely to be obtained.

As described above, the perovskite oxide of the present invention is a plural component system in which $BiFeO_3$ is solidified with another component and doped with donor X that compensate for valence transition of Fe. The present invention may provide a perovskite oxide of novel composition with an excellent ferroelectric performance (piezoelectric performance) by solidifying $BiFeO_3$ with an oxide that can, in theory, become a perovskite oxide with an excellent ferroelectric performance (piezoelectric performance). For example, by solidifying $BiFeO_3$, which is solely like to take a perovskite structure, with $BDO_3$, which includes an oxide which can not take or is difficult to take a perovskite structure under normal pressure but can, in theory, become a perovskite oxide with an excellent ferroelectric performance (piezoelectric performance), a perovskite oxide of novel composition with an excellent ferroelectric performance (piezoelectric performance) may be provided without requiring a high pressure process.

The present invention may provide an advantageous effect of preventing leakage current due to valence transition of Fe by doping donor X, whereby ferroelectric performance (piezoelectric performance) appears effectively. Through donor X doping, donor X can compensate for A-site defect and valence variation due to oxygen vacancy accompanying the A-site defect, so that the property degradation may be prevented.

The present invention may provide an advantageous effect of decreasing coercive electric field Ec through donor X doping. The decrease in coercive electric field Ec causes the piezoelectric performance to appear from a lower electric field, leading to a higher piezoelectric performance. Also, the invention allows a novel composition design. According to the present invention, an eco-friendly perovskite oxide, which does not include Pb or with a low amount of Pb in comparison with a lead system, such as PZT or the like, may be provided.

[Oxide Composition]

A oxide composition of the present invention is characterized in that it includes the perovskite oxide of the present invention described above. The oxide composition of the present invention may include any component other than the perovskite oxide of the present invention, such as a perovskite oxide other than the perovskite oxide of the present invention, other oxides, various types of additive elements, and a sintering agent.

[Oxide Body (Piezoelectric Body, Ferroelectric Body)]

An oxide body of the present invention is characterized in that it includes the perovskite oxide of the present invention described above. The oxide body may be formed into various designs, including film and bulk ceramic designs.

According to the present invention, an oxide body showing a piezoelectric performance (piezoelectric body of film design or bulk ceramic design) may be provided. The piezoelectric body of the present invention is preferably applicable to actuators or the like mounted on inkjet recording heads, magnetic read/write heads, MEMS (micro electromechanical systems) devices, micropumps, ultrasonic probes, and the like.

According to the present invention, an oxide body showing a ferroelectric performance (ferroelectric body of film design or bulk ceramic design) may be provided. The ferroelectric body of the present invention is preferably applicable to ferroelectric devices, such as a ferroelectric memory (FeRAM) and the like.

Hereinafter, a piezoelectric body of the present invention will be described. Preferably, the piezoelectric body of the present invention contains a ferroelectric phase having crystal orientation. Piezoelectric strains may include the following, but not limited to:

(1) an ordinary piezoelectric strain in which expansion or contraction occurs in a direction of applied electric field when the vector component of spontaneous polarization axis corresponds to the direction of applied electric field according to the increase or decrease in applied electric field intensity (electric-field induced strain);

(2) a piezoelectric strain produced by increasing or decreasing the electric field intensity and reversibly rotating the polarization axis by non-180°;

(3) a piezoelectric strain caused by the change in volume due to crystal phase transitions induced by increasing or decreasing the electric field intensity; and (4) a piezoelectric strain that makes use of engineered domain effect, which is capable of providing a larger strain, obtained by using a material having a property to cause phase transitions by the application of an electric field and forming a crystal orientation structure containing a ferroelectric phase having crystal orientation in a direction different from the spontaneous polarization direction (when making use of the engineered domain effect, the piezoelectric body may be driven under the condition in which phase transitions occur or under the condition in which phase transitions do not occur).

The piezoelectric strain (2) that makes use of reversible rotation of non-180° is described, for example, in U.S. Patent Application Publication No. 20060279178. The piezoelectric strain (3) that makes use of phase transitions is described, for example, in Japanese Patent No. 3568107. The piezoelectric strain (4) that makes use electric field induced phase transitions and engineered domain effect is described, for example, in a literature by S. E. Park and T. R. Shrout, "Ultrahigh strain and piezoelectric behavior in relaxor based ferroelectric single crystals", Journal of Applied Physics, Vol. 82, No. 4, pp. 1804-1811, 1997 and International Patent Publication No. WO2007/034903 filed by the inventors of the present invention.

The use of the piezoelectric strains (1) to (4) individually or in combination allows a desired piezoelectric strain to be obtained. In each of the piezoelectric strains (1) to (4), a larger piezoelectric strain may be obtained by forming a crystal orientation structure according to the strain generation mechanism. The piezoelectric body of the present invention may include, for example, a ferroelectric phase of (100) orientation and/or (111) orientation.

Where the piezoelectric strains (1) to (4) are used individually or in combination, it is preferable that the piezoelectric body of the present invention has a ferroelectric phase having crystal orientation in a direction different from the spontaneous polarization axis direction. For example, in a system of the piezoelectric strain (4), it is preferable that the ferroelectric phase in which phase transitions occur has crystal orientation in a direction different from the spontaneous polarization axis direction, and it is more preferable that it has crystal orientation in a direction substantially corresponding to the spontaneous polarization axis direction after phase transition. Normally, the crystal orientation direction corresponds to the electric field application direction.

The spontaneous polarization axis directions of ferroelectric bodies are as follows: tetragonal system: <001>, orthorhombic system: <110>, and rhombohedral system: <111>. Preferably, the ferroelectric phase having crystal orientation in a direction different from the spontaneous polarization axis direction is at least one ferroelectric phase selected from the group consisting of a rhombohedral phase having crystal orientation substantially in <100> direction, rhombohedral phase having crystal orientation substantially in <110> direction, a tetragonal phase having crystal orientation substantially in <110> direction, a tetragonal phase having crystal orientation substantially in <111> direction, an orthorhombic phase having crystal orientation substantially in <100> direction, and an orthorhombic phase having crystal orientation substantially in <111> direction.

Preferably, the ferroelectric phase having crystal orientation in a direction different from the spontaneous polarization axis direction is a ferroelectric phase having a property to make phase transition at least in part when an electric filed is applied in a direction different from the spontaneous polarization axis direction of the ferroelectric phase.

In the electric field induced phase transition system described above, a volume change occurs by the change in crystal structure due to phase transitions, whereby a large amount of strain displacement may be obtained. Application of electric field in a direction substantially corresponding to the spontaneous polarization axis direction after phase transition is preferable to application of electric field in the spontaneous polarization axis direction before phase transition in that it may provide a larger amount of strain displacement by the engineered domain effect prior to phase transition.

Application of electric field in a direction substantially corresponding to the spontaneous polarization axis direction after phase transition causes phase transitions to occur more easily. The reason may be assumed that the crystal structure is more stable when the spontaneous polarization direction is matched with the electric application direction and phase transitions occur easily to the more stable crystal system. There may be a case in which some of ferroelectric phases remain as they are without making phase transitions even when an electric field sufficient to complete phase transitions, but this may cause phase transitions to occur effectively so that the ratio of ferroelectric phases remaining without making phase transitions may be reduced when an electric field sufficient to complete phase transitions is applied. As a result, a larger amount of strain displacement may be obtained than that when the electric field is applied in the spontaneous axis direction before phase transition. Further, after phase transition, the application direction of electric field substantially matches with the spontaneous polarization axis direction, so that the piezoelectric effect of the ferroelectric phases after phase transition appears effectively and a large amount of strain displacement may be obtained stably.

As described above, when the application direction of electric field is substantially matched with the spontaneous polarization axis direction after phase transition, a large amount of strain displacement may be obtained before, during, and after phase transition. This effect may be obtained when at least the spontaneous polarization axis direction before phase transition differs from the application direction of electric field, and appears more significantly if the application direction of electric field is close to the spontaneous polarization axis direction after phase transition.

As for the piezoelectric body containing ferroelectric phases having crystal orientation, an oriented film (one axis oriented film), an epitaxial film (three axis oriented film), and a grain oriented sintered ceramics body may be cited.

The oriented film may be obtained by performing film forming under a condition in which one axis oriented crystal structure is formed using any of known thin film forming methods, such as gas phase methods, including sputtering, MOCVD, plasma CVD, PLD (pulse laser deposition), and the like, or liquid phase methods, including sol gel method, metal organic decomposition, and the like.

The epitaxial film may be formed by using materials having a good lattice matching with a piezoelectric film for the substrate and lower electrode. As for the preferable combination of substrate/lower electrode, $SrTiO_3/SrRuO_3$, MgO/Pt, or the like may be cited.

The grain oriented sintered ceramics body may be formed by hot-press method, sheet method, lamination press method in which a plurality of sheets obtained by sheet method is laminated and pressed, or the like.

[Example of Film Forming System and Method]

Figure 1:
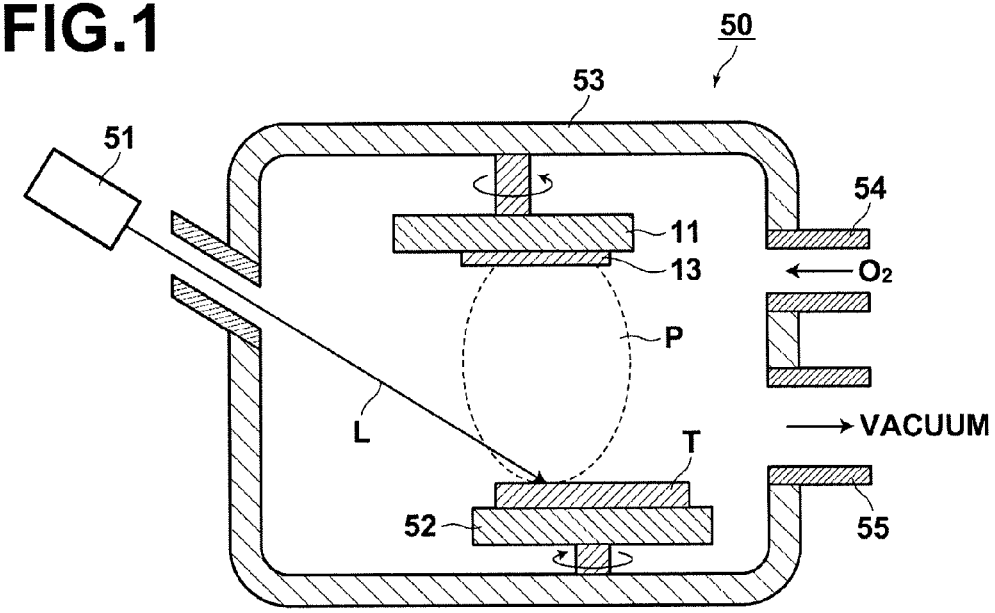
FIG. 1 is a schematic diagram of a pulse laser deposition system, illustrating the construction thereof.

An example of film forming system 50 and method for forming the perovskite oxide film of the present invention will be described with reference to FIG. 1. Here, epitaxial film forming by PLD method will be described as an example.

In the PLD method, when target T placed on rotatable target holder 52 is irradiated with laser light L emitted from pulse laser 51, plasma (plume P) is generated in a direction substantially perpendicular to the surface of target T, and a component of target T is turned into a plasma or molecular state and reaches substrate 11. Then, crystal nucleation and crystal growth occurs on substrate 11 while migrating with respect to each laser pulse and crystal growth is obtained by repeating this process. If film 13 to be formed is an oxide film, it is necessary to make the inside of vacuum chamber 53 a low-oxygen partial pressure atmosphere by oxygen introducing section 54 and pressure reducing section 55. That is, the film property and crystal structure to be obtained vary with the plasma state and oxygen partial pressure.

There is not a specific limitation on the substrate on which the perovskite oxide film of the present invention is formed, and it is preferable to select a material having a good lattice matching with the film to be formed. The use of a substrate having lattice matching for epitaxial growth allows a perovskite oxide epitaxial film having identical crystal orientation to that of the substrate to be formed.

For example, in a case where a perovskite oxide film (P) is formed on a substrate in the form in which (001) face of the perovskite oxide film (P) is lattice matched with face (001) of the substrate, and the lattice constant of the substrate and that of the perovskite oxide film (P) are assumed to be Cs and C respectively, it is preferable to select a material that satisfies $nCs/mC$ (n, m=1 to 5) falls within the range from 0.95 to 1.05.

As for the substrate having a good lattice matching with Bi system oxide and allows epitaxial film forming, a perovskite single crystal substrate is preferable. As for the perovskite single crystal substrate, $SrTiO_3$, $NdGaO_3$, or $LaAlO_3$ substrate maybe cited. A lattice matched buffer layer and lower electrode may be provided on the substrate.

Where the substrate is other than the perovskite single crystal substrate, Si or MgO substrate may be cited, and it is preferable that the substrate is provided with a buffer layer or the like that allows epitaxial growth. Such combinations of substrate and buffer layer or the like include $Pt/Ti/SiO_2/Si$, $SrRuO_3/MgO/Si$, $SrRuO_3/YSZ/CeO_2/Si$, $SrRuO_3/MgO$, and the like.

The inventors of the present invention assume that a Bi system compound has a high vapor pressure and tends to evaporate easily so that bismuth oxide evaporation influence the crystal growth, thereby making difficult to take a perovskite structure. In particular, when a Bi system perovskite oxide film is formed on a Si substrate through an electrode material having a low gas barrier property, such as Pt/Ti electrode, it is conceivable that evaporated bismuth oxide reaches the Si substrate and reacts with Si, whereby the crystal growth is likely to be influenced.

Further, as described above, the atoms and molecules reached the substrate repeat crystal nucleation and crystal growth with respect to each laser pulse while migrating. Accordingly, an excessively high laser pulse frequency may cause that, before a migrated atom takes a perovskite structure, a next atom arrives and accumulates, thereby forming a different phase. On the other hand, an excessively low laser pulse frequency may result in a low film forming speed and a desired film thickness may not be ensured. In particular, it is thought that when the amount of Fe, which is likely to take a perovskite structure with Bi, is reduced, a different phase is more likely to be formed.

In the PLD method, for example, by preventing the evaporation of Bi system compound through the optimization of oxygen partial pressure, and optimizing the plasma state by controlling the laser pulse frequency, the ratio of different phases may be reduced and a perovskite oxide film containing the perovskite oxide (P) of the present invention may be formed.

[Piezoelectric Device (Ferroelectric Device) and Inkjet Recording Head]

Figure 2:
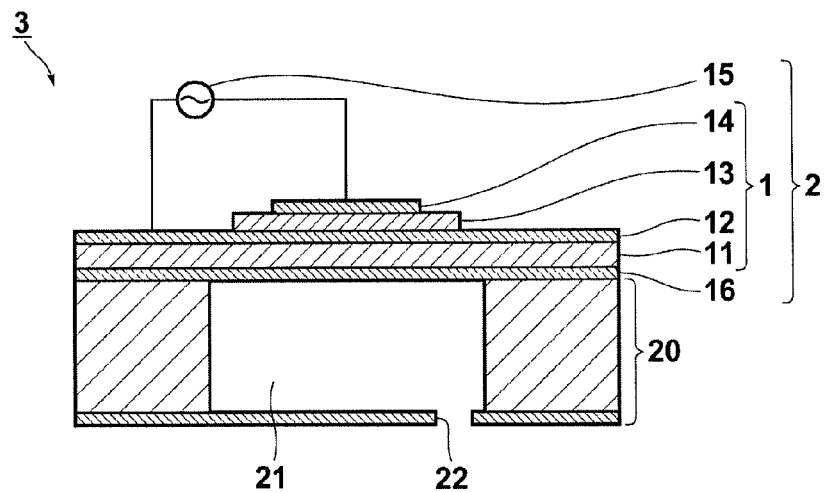
FIG. 2 is a cross-section of a relevant part of a piezoelectric element according to an embodiment of the present invention and an inkjet recording head (liquid discharge apparatus) having the same, illustrating the construction thereof.

The structure of a piezoelectric device according to an embodiment of the present invention and an inkjet recording head (liquid discharge device) having the piezoelectric device will be described with reference to the accompanying drawings. FIG. 2 is a cross-sectional view (cross-sectional view in the thickness direction of the piezoelectric device) of a relevant part of the inkjet recording head. Each of the components is not necessarily drawn to scale for facilitating visibility.

Piezoelectric device 1 shown in FIG. 2 is a device which includes lower electrode 12, piezoelectric film (ferroelectric film) 13, and upper electrode 14 stacked on substrate 11 in this order. Piezoelectric film 13 is a perovskite oxide film containing the perovskite oxide (P) of the present invention, and an electric field is applied in the thickness direction by upper electrode 14 and lower electrode 12.

There is not a specific limitation on substrate 11, and a substrate that lattice matches well with the perovskite oxide film is preferably used. There is not a specific limitation on lower electrode 12 and is preferable to be an epitaxial film formed on substrate 11 by epitaxial growth and allows epitaxial growth of piezoelectric film 13 to be formed thereon. There is not a specific limitation on the major component of lower electrode 14 and, a metal, such as Au, Pt, Ir, $IrO_2$, $RuO_2$, $LaNiO_3$, or $SrRuO_3$, a metal oxide, or a combination thereof may be used. Further, an electrode material generally used for semiconductor processing, such as Al, Ta, Cr, or Cu may be used.

There is not a specific limitation on the thicknesses of lower electrode 12 and upper electrode 14 and are preferable to be in the range from 50 nm to 500 nm. There is not a specific limitation on the thickness of piezoelectric film 13 and is preferable to be in the range from 500 nm to several tens of micrometers.

Piezoelectric actuator 2 includes piezoelectric device 1 and vibration plate 16, which vibrates according to stretching/contraction of piezoelectric film 13, attached to the lower surface of substrate 11 of piezoelectric device 1. Piezoelectric actuator 2 further includes control means 15, such as a drive circuit or the like, for drive controlling piezoelectric device 1. Inkjet recording head (liquid discharge device) 3 is a device basically constituted by piezoelectric actuator 2 and an ink nozzle (liquid storage/discharge member) 20, having an ink storage chamber (liquid storage chamber) 21 for storing an ink and an ink discharge opening (liquid discharge opening) 22 for discharging the ink from ink storage chamber 21 to the outside, attached to the bottom surface of piezoelectric actuator 2. In inkjet recording head 3, piezoelectric device 1 is stretched or contracted by increasing or decreasing the electric field applied to piezoelectric device 1 to control the ink discharge amount from ink storage chamber 21.

Instead of attaching vibration plate 16 and ink nozzle 20 made of separate members to substrate 11, portions of substrate 11 may be formed into vibration plate 16 and ink nozzle 20. For example, where substrate 11 is a laminated substrate, such as a SOI substrate, ink storage chamber 21 may be formed by etching substrate 11 from the bottom side, and vibration plate 16 and ink nozzle 20 may be formed by processing the substrate itself.

Piezoelectric device 1 includes piezoelectric film 13 containing the perovskite oxide (P) of the present invention described above, and according to the present embodiment, piezoelectric device 1 with an excellent piezoelectric performance may be provided.

[Inkjet Recorder]

Figure 3:
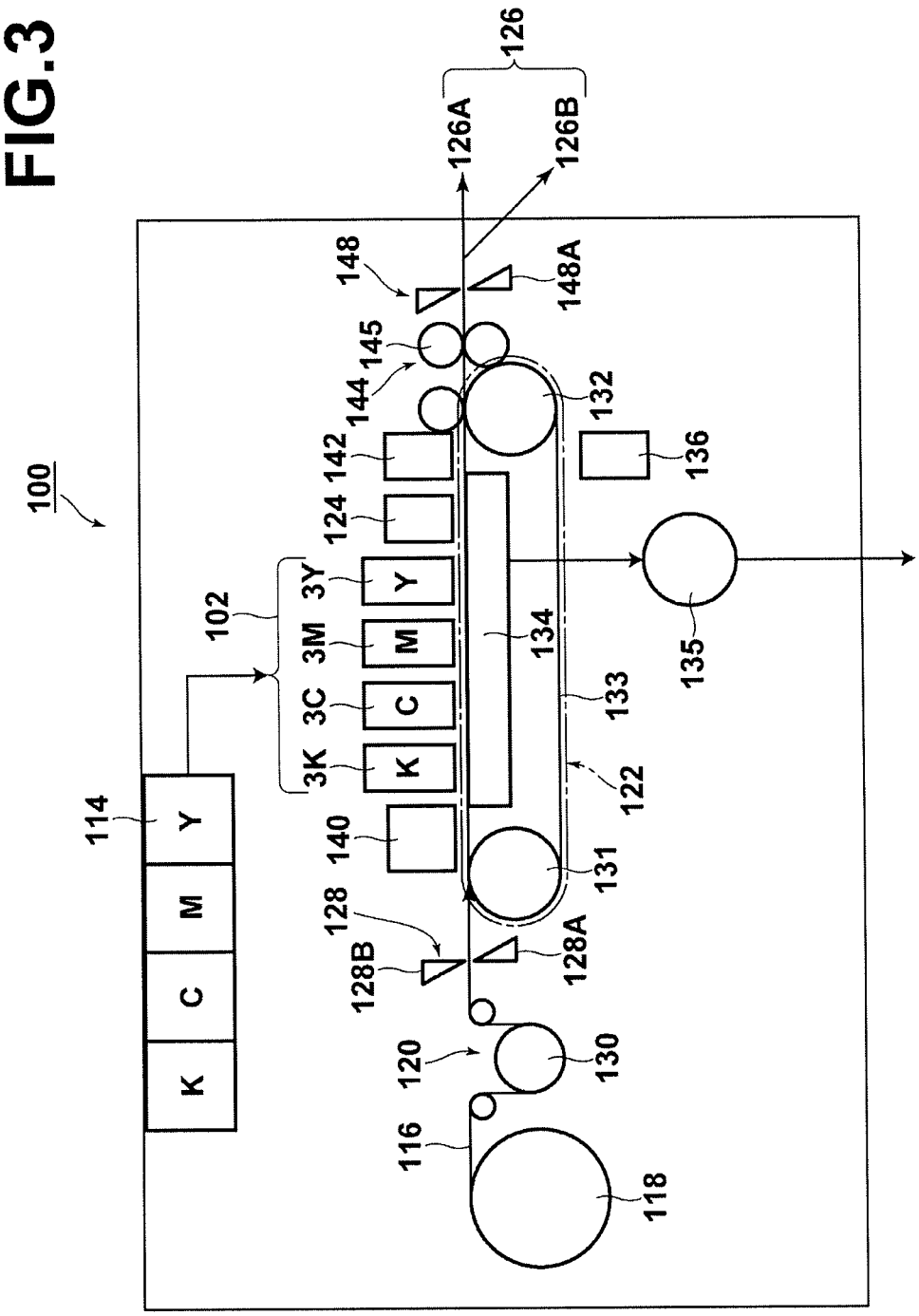
FIG. 3 illustrates an example construction of an inkjet recording device having the inkjet recording head shown in FIG. 2.
Figure 4:
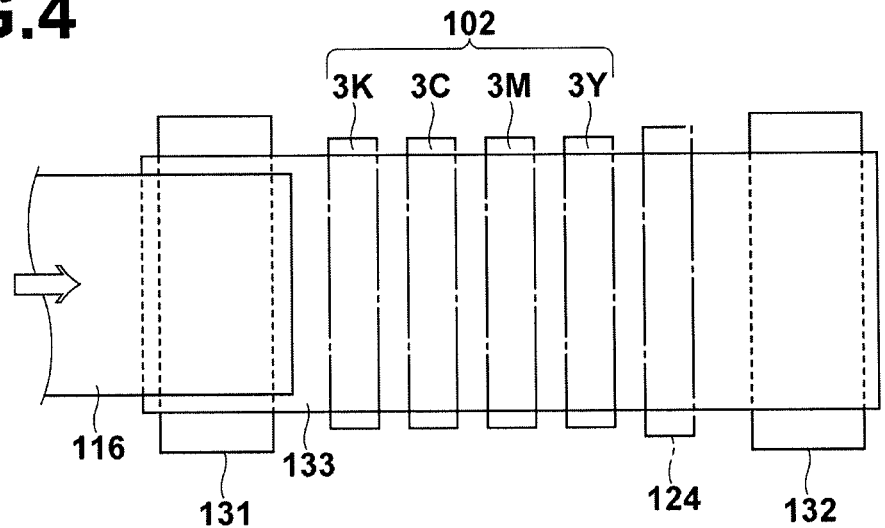
FIG. 4 is a partial top view of the inkjet recording device

An example configuration of an inkjet recorder having an inkjet recording head 3 according to the embodiment described above will be described with reference to FIGS. 3 and 4. FIG. 3 is an overall view and FIG. 4 is a partial top view of the recorder.

Illustrated inkjet recorder 100 basically includes print section 102 having a plurality of inkjet recording heads (hereinafter, simply "heads" or "head") 3K, 3C, 3M, and 3Y, each for each ink color, ink storage/mount section 114 for storing inks to be supplied to each of heads 3K, 3C, 3M, and 3Y, paper feed section 118 for feeding recording paper 116, decurling section 120 for decurling recording paper 116, suction belt conveyor 122, disposed opposite to the nozzle surface (discharge surface) of print section 102, for conveying recording paper 116 while maintaining flatness of recording paper 116, print detection section 124 for reading a result of printing performed by print section 102, and paper discharge section 126 for discharging a printed paper (printed material) to the outside. Each of Heads 3K, 3C, 3M, and 3Y constituting print section 102 corresponds to inkjet recording head 3 according to the embodiment described above.

In decurling section 120, recording paper 116 is decurled by heating with heating drum 130 in the direction opposite to the curled direction of recording paper 116 wound on a roll. For the recorder that uses a roll paper, cutter 128 for cutting the roll paper is provided at a latter stage of decurling section 120, as illustrated in FIG. 3, and the roll paper is cut out to a desired size. Cutter 128 includes fixed blade 128A having a length greater than the width of the conveyor path and round blade 128B that moves along fixed blade 128A, in which fixed blade 128A is provided on the rear side of the printing surface and round blade 128B is provided on the printing surface side across the conveyor path. The recorder that uses a cut sheet does not require cutter 128.

Decurled and cutout recording paper 116 is fed to suction belt conveyor 122. Suction belt conveyor 122 includes rollers 131, 132, and endless belt 133 wound between them, and configured such that at least the portion opposite to the nozzle surface of print section 102 and the sensor surface of print detection section 124 becomes a level plane (flat plane).

Belt 133 has a width greater than that of recording paper 116 and many suction holes (not shown) are formed in the belt face. Suction chamber 134 is provided at the position opposite to the nozzle surface of print section 102 and the sensor surface of print detection section 124 in the inner side of belt 133 wound between rollers 131, 132. Suction chamber 134 is suctioned by fan 135 so as to have a negative pressure, thereby suction-holding recording paper 116 on belt 133.

Power is supplied to at least either one of rollers 131, 132 from a motor (not shown), whereby belt 133 is driven in clockwise direction in FIG. 3 and recording paper 116 held on belt 133 is conveyed from left to right in FIG. 3.

When a borderless print or the like is printed, the ink adheres also to belt 133, so that belt cleaning section 136 is provided at a predetermined position (appropriate position other than the printing area) on the outer side of belt 133.

Heating fan 140 is provided on the upstream side of print section 102 on the paper conveyer path formed by suction belt conveyor 122. Heating fan 140 blows heated air onto recording paper 116 before printing to heat recording paper 116. By heating recording paper 116 immediately preceding the printing, spotted inks on recording paper 116 are dried faster.

Print section 102 is a so-called full line head in which line heads having a length corresponding to a maximum paper width are disposed in a direction (main scanning direction) orthogonal to the paper feed direction (FIG. 4). Each of printing heads 3K, 3C, 3M, and 3Y is a line head having a plurality of ink discharge openings (nozzles) disposed over a length which exceeds at least one side of maximum size of recording paper 116.

Heads 3K, 3C, 3M, and 3Y corresponding to black (K), cyan (C), magenta (M), and yellow (Y) are disposed in this order from the upstream side along the paper feed direction of recording paper 116. A color image is recorded on recording paper 116 while being conveyed by discharging a color ink from each of heads 3K, 3C, 3M, and 3Y.

Print detection section 124 is constituted by a line sensor or the like for imaging inkjet results of print section 102 to detect an inkjet fault, such as clogging of a nozzle, from the obtained inkjet image. Post drying section 142 constituted by a heating fan or the like for drying the printed image surface is provided at the latter stage of print detection section 124. It is desirable that the printed surface avoids any contact until the inks are dried, so that a method of blowing heated air is preferable.

Heating/pressing section 144 for controlling the glossiness of an image surface is provided at the latter stage of post drying section 142. In heating/pressing section 144, the image surface is pressed, while being heated, by pressing rollers 145 having a predetermined uneven surface shape to transfer the uneven shape to the image surface.

The printed material obtained in the manner described above is discharged from paper discharge section 126. Preferably, an intended print (print on which an intended image is printed) and a test print are discharged separately. Inkjet recorder 100 includes a selection means (not shown) for selecting and switching paper discharge paths between intended prints and test prints to send them discharge section 126A and 126B respectively. Where an intended image and a test image are printed on a large paper in parallel at the same time, cutter 148. 148A may be provided to separate the test print portion. Inkjet recorder 100 is structured in the manner as described above.

(Design Change)

The present invention is not limited to the embodiment described above, and may be changed in design without departing from the sprit of the present invention.

EXAMPLES

Examples and Comparative Examples according to the present invention will now be described.

Examples 1, 2 and Comparative Examples 1 to 3

In each of the examples, a (100) $SrRuO_3$ lower electrode was formed on the surface of a (100) $SrTiO_3$ single crystal substrate by PLD method with a thickness of 0.2 μm. Then, a perovskite oxide film was formed by PLD method under the following film forming conditions. In each of the examples, the film forming was performed under the same conditions other than the composition of the target.

Target Compositions and Film Compositions:
Target Composition of Example 1: $Bi_{1.1}(Fe_{0.72}, Al_{0.08}, Si_{0.2})O_3$
Film Composition of Example 1: $Bi(Fe_{0.72}, Al_{0.08}, Si_{0.2})O_3$
Target Composition of Example 2: $Bi_{1.1}(Fe_{0.55}, Al_{0.35}, Si_{0.1})O_3$
Film Composition of Example 2: $Bi(Fe_{0.55}, Al_{0.35}, Si_{0.1})O_3$
Target Composition of Comparative Example 1: $Bi_{1.1}FeO_3$
Film Composition of Comparative Example 1: $BiFeO_3$
Target Composition of Comparative Example 2: $Bi_{1.1}(Fe_{0.9}, Al0.1)O_3$
Film Composition of Comparative Example 2: $Bi(Fe_{0.9}, Al_{0.1})O_3$
Target Composition of Comparative Example 3: $Bi_{1.1}(Fe_{0.7}, Al_{0.3})O_3$
Film Composition of Comparative Example 2: $Bi(Fe_{0.7}, Al_{0.3})O_3$ Film Forming Conditions Common to Examples 1, 2 and Comparative Examples 1 to 3

SRO/STO Substrate
Laser Power: 350 mJ
Laser Pulse Frequency: 5 Hz
Oxygen Partial Pressure: 6.66 Pa (50 mm Torr)
Distance between Substrate and Target: 50 mm
Target Revolutions: 9.7 rpm
Substrate Temperature: 585° C.
Film Forming Time: 60 to 100 min
Film Thickness: 400 to 700 nm X-ray analysis (XRD) measurements performed on the obtained films showed that each of the films was a perovskite single phase film with (100) preferred orientation. Further, a Pt upper electrode was formed on each of the perovskite films with a thickness of 150 nm by sputtering to obtain piezoelectric devices.

<XANES Measurements>

XANES Measurements were performed on Comparative Example 1, and XANES spectrum (Fe K-edge) obtained thereby is shown in FIG. 5. Two peaks are observed at 7127 eV and 7132 eV, the former of which is originated from $Fe^{+2}$ and the latter of which is originated from $Fe^{+3}$. From the ratio of peak intensities, it is estimated that $Fe^{2+}:Fe^{3+}=5:95$ (molar ratio).

<P-E Characteristics>

Figure 6:
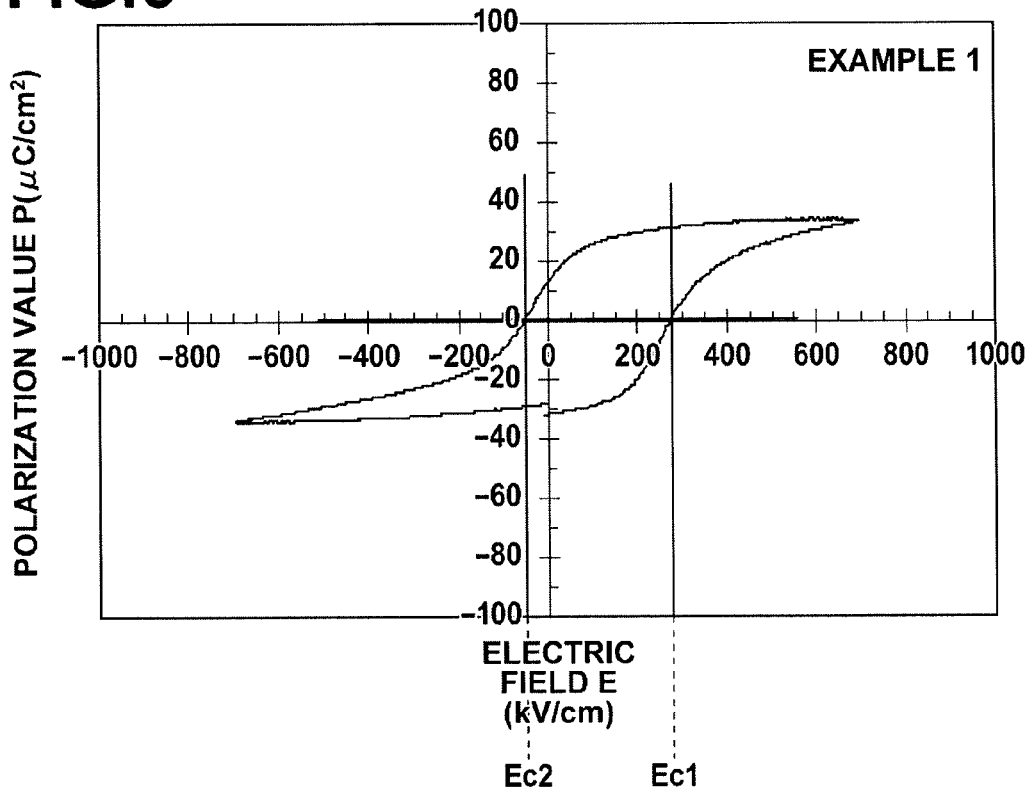
FIG. 6 shows P-E hysteresis characteristics of Example 1.
Figure 7:
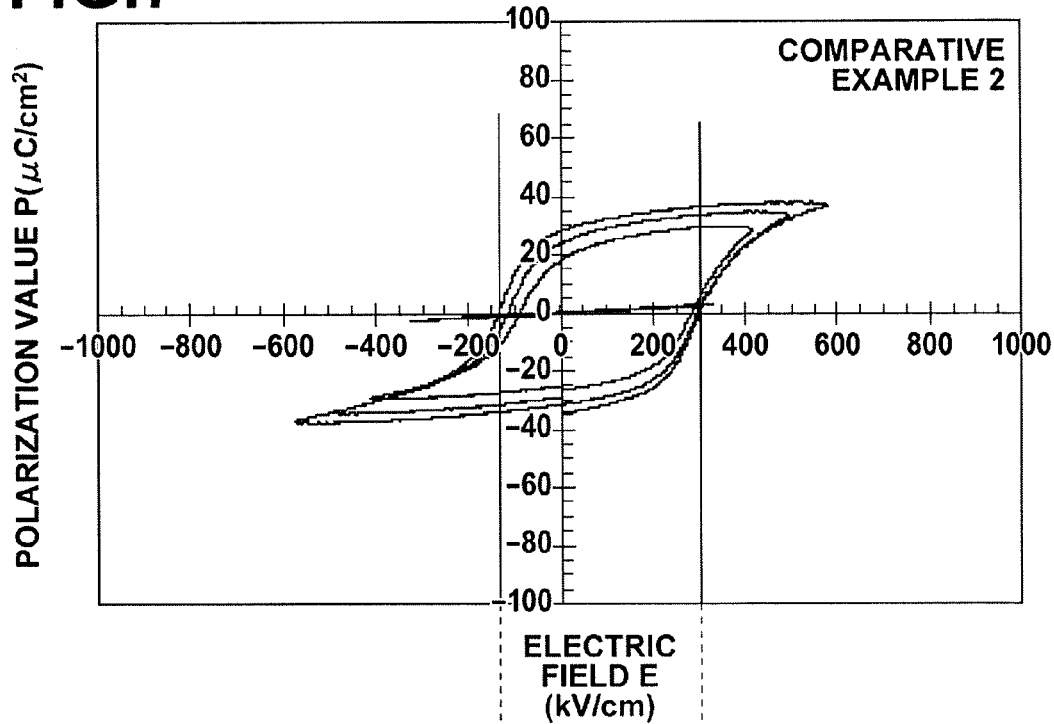
FIG. 7 shows P-E hysteresis characteristics of Comparative Example 2.
Figure 8:
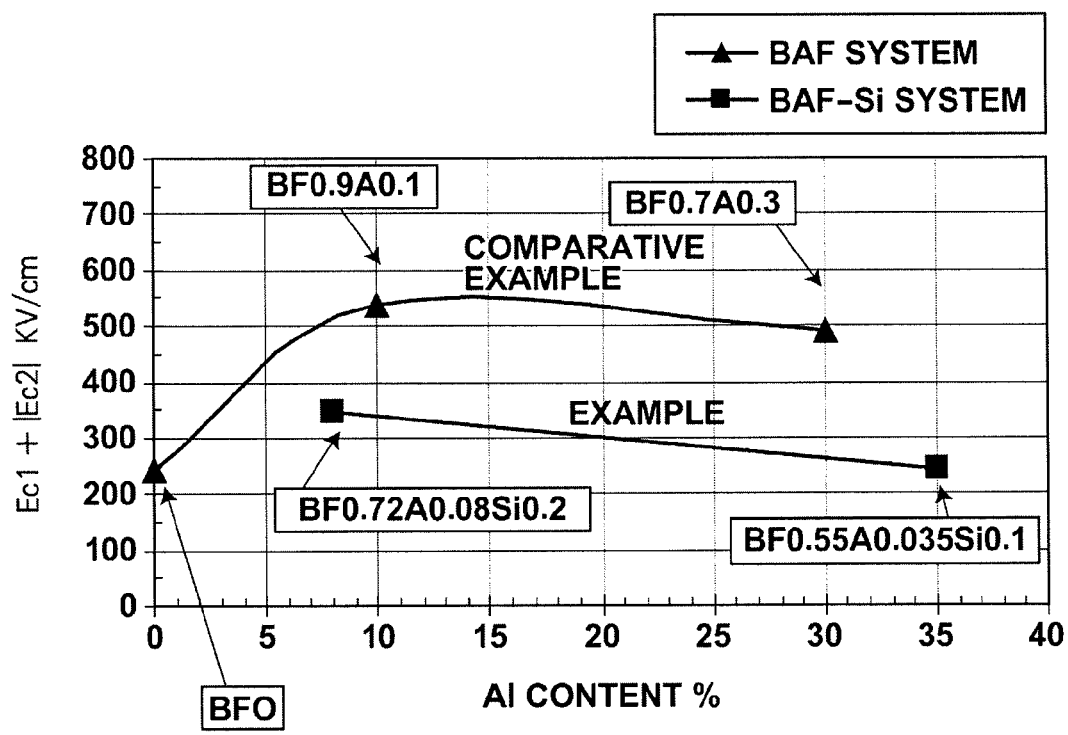
FIG. 8 shows coercive electric field comparative data of Examples 1, 2 and Comparative Examples 1 to 3.

With respect to each of the examples, bipolar polarization-electric field characteristics (PE hysteresis characteristics) were measured at room temperature (about 25° C.) by applying an electric field to the perovskite oxide film. The measurement frequency was set to 10 kHz. As the representatives, measurement results of Example 1 and Comparative Example 2 are shown in FIGS. 6 and 7 respectively. The coercive electric fields on positive and negative electric field sides are designated as Ec1 and Ec2 respectively. The relationship between Al density in B-site and Ec1+|Ec2| is shown in FIG. 8. As shown in FIG. 8, in $Bi(Fe, Al)O_3$ system, it has been known that the coercive electric field Ec is decreased by doping Si in B-site. This means that ferroelectricity (piezoelectricity) appears by a lower electric field. In FIG. 8, B, F, A, and O represent Bi, Fe, Al, and oxygen respectively.

Examples 3, 4 and Comparative Example 4

In each of the examples, an MgO buffer layer with a thickness of 50 nm and a (100) $SrRuO_3$ lower electrode with a thickness of 300 nm are epitaxially grown serially on the surface of a (100) Si single crystal substrate (10 mm×10 mm, 0.5 mm thick). Then, a perovskite oxide film represented by $(Bi_a, B'_b) (Fe_{1-(1+\alpha)b}, Ti_{(1+\alpha)b})O_3$ was formed by PLD method under the following film forming conditions. In each of the examples, the film forming was performed under the same conditions other than the composition of the target.

Target Composition of Example 3: $(Bi_{0.7}, Ba_{0.3})(Fe_{0.691}, Ti_{0.309})O_3$ ($\alpha=0.03$ in the formula above)

Target Composition of Example 4: $(Bi_{0.7}, Ba_{0.3})(Fe_{0.676}, Ti_{0.324})O_3$ ($\alpha=0.08$ in the formula above)

Target Composition of Comparative Example 4: $(Bi_{0.7}, Ba_{0.3}) (Fe_{0.7}, Ti_{0.3})O_3$ ($\alpha=0$ in the formula above)

Film Forming Conditions Common to Examples 3, 4 and Comparative Example 4

Figure 9:
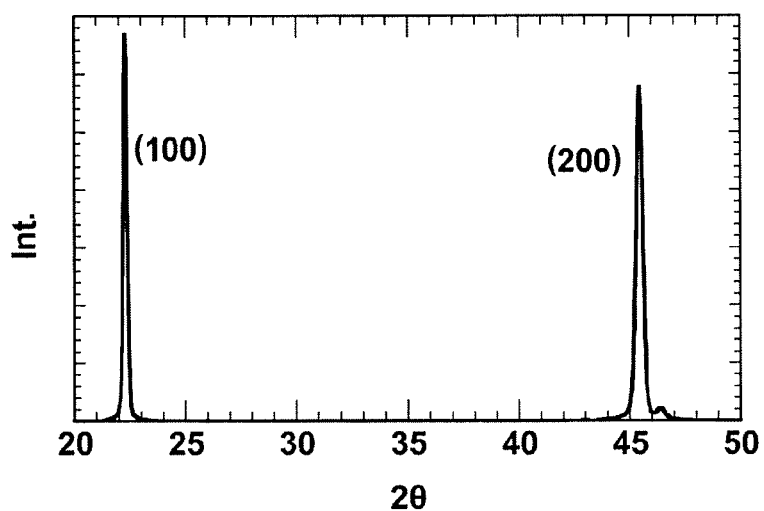
FIG. 9 shows an XRD spectrum of Example 4.

SRO/MgO/Si Substrate
Laser Power: 200 mJ
Laser Pulse Frequency: 5 Hz
Oxygen Partial Pressure: 6.66 Pa (50 mm Torr)
Distance between Substrate and Target: 50 mm
Target Revolutions: 9.7 rpm
Substrate Temperature: 60° C.
Film Forming Time: 100 min
Film Thickness: 1 µm X-ray analysis (XRD) measurements performed on the obtained films showed that each of the films was a perovskite single phase film with (100) or (001) preferred orientation. As the representative, XRD spectrum of Example 4 is shown in FIG. 9. Thereafter, a Pt upper electrode was formed on each of the perovskite films with a thickness of 100 nm by sputtering to obtain piezoelectric devices.

<I-V Characteristics>

Figure 10:
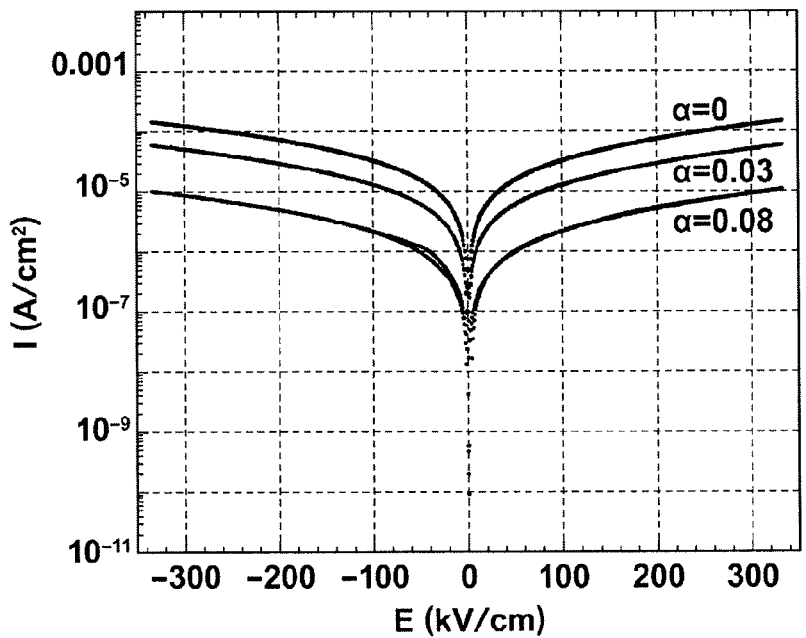
FIG. 10 shows I-V characteristics of Examples 3, 4 and Comparative Example 4.

With respect to each of the examples, I-V characteristics were measured, results of which are shown in FIG. 10. As shown in FIG. 10, it has been known that Example 3 with $\alpha=0.03$ and Example 4 with $\alpha=0.08$ have a smaller leakage current in comparison with that of Comparative Example 4 with $\alpha=0$.

<Piezoelectricity>

With respect to piezoelectric device obtained in each of the examples, the amount of tip displacement was measured when a voltage of 50 V was applied using a cantilever (15×25 mm, film thickness of 0.5 mm). Examples 3 and 4 may provide a higher piezoelectric performance than that of Comparative Example 4.

Strain Amount S (nm) of Comparative Example 4 ($\alpha=0$) =0.73 µm
Strain Amount S (nm) of Example 3 ($\alpha=0.03$)=0.92 µm
Strain Amount S (nm) of Example 4 ($\alpha=0.08$)=1.32 µm Examples 5, 6 and Comparative Example 5

Piezoelectric devices were obtained in the same manner as that of Examples 3, 4 and Comparative Example 4 other than film forming conditions of perovskite oxide films. In Examples 5, 6 and Comparative Example 5, the film forming was performed under the same conditions other than target compositions, which are shown below.

Target Composition of Example 5: $(Bi_{0.79}, Ba_{0.21})(Fe_{0.74}, Mn_{0.05}, Ti_{0.19}, Nb_{0.02})O_3$ Target Composition of Example 6: $(Bi_{0.81}, Ba_{0.19})(Fe_{0.76}, Mn_{0.05}, Ti_{0.19})O_3$ Target Composition of Comparative Example 5: $(Bi_{0.8}, Ba_{0.2})FeO_3$ Film Forming Conditions Common to Examples 5, 6 and Comparative Example 5

SRO/MgO/Si Substrate
Laser Power: 200 mJ
Laser Pulse Frequency: 10 Hz
Oxygen Partial Pressure: 6.66 Pa (50 mm Torr)
Distance between Substrate and Target: 50 mm
Substrate Temperature: 580° C.
Film Thickness: 1.2 µm <XRD Measurements>

XRD measurements performed on the perovskite oxide obtained in each of the examples showed that each of the films was a perovskite single phase film with (100) preferred orientation.

<P-E Characteristics>

Figure 11:
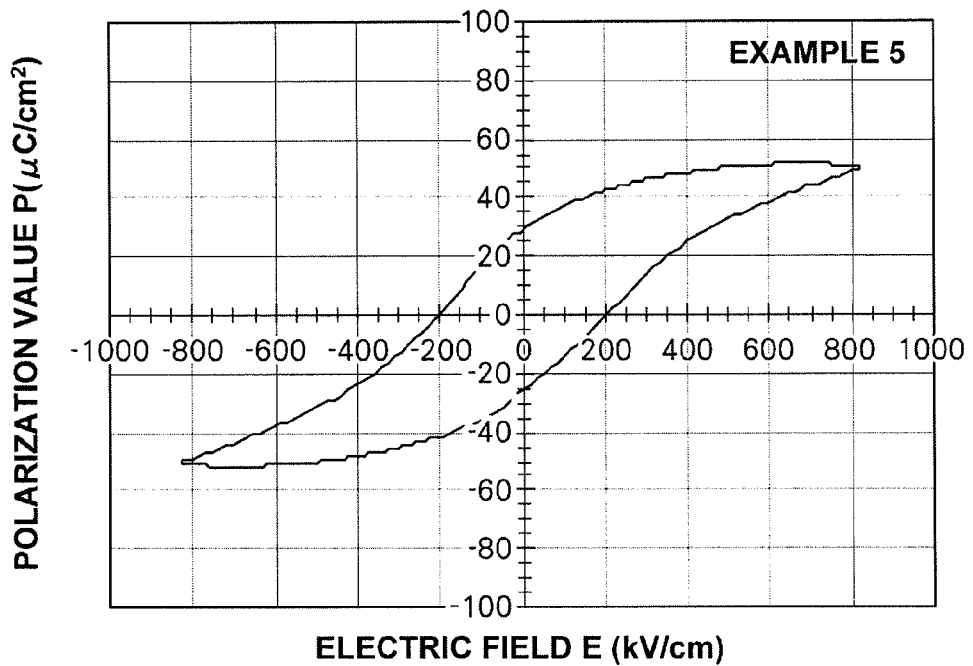
FIG. 11 shows P-E hysteresis characteristics of Example 5.
Figure 12:
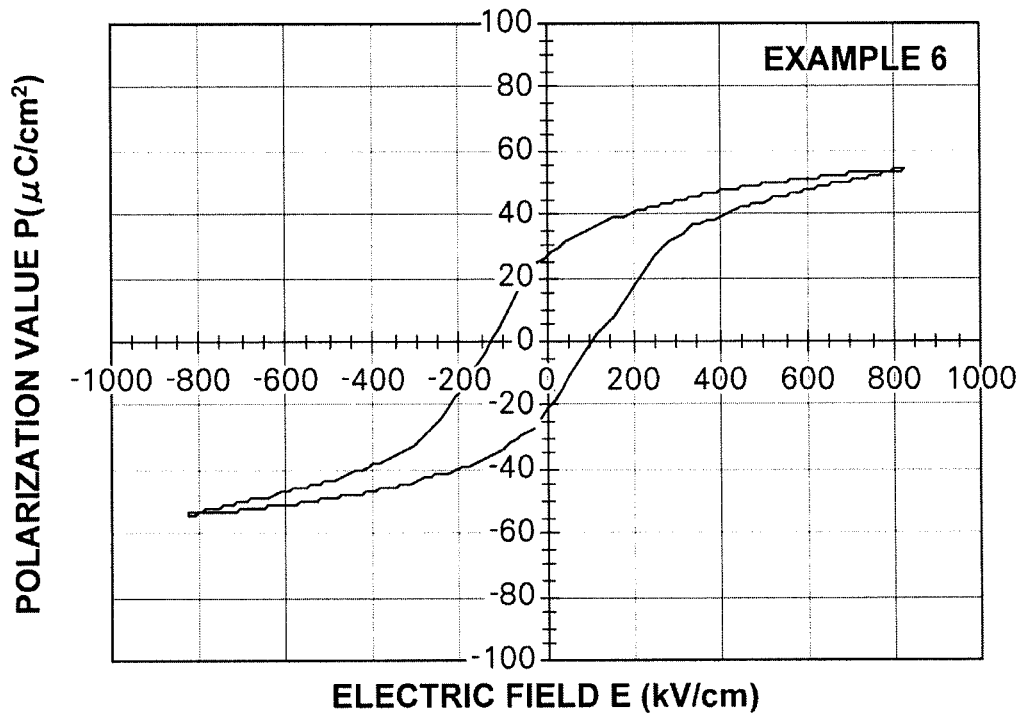
FIG. 12 shows P-E hysteresis characteristics of Example 6.
Figure 13:
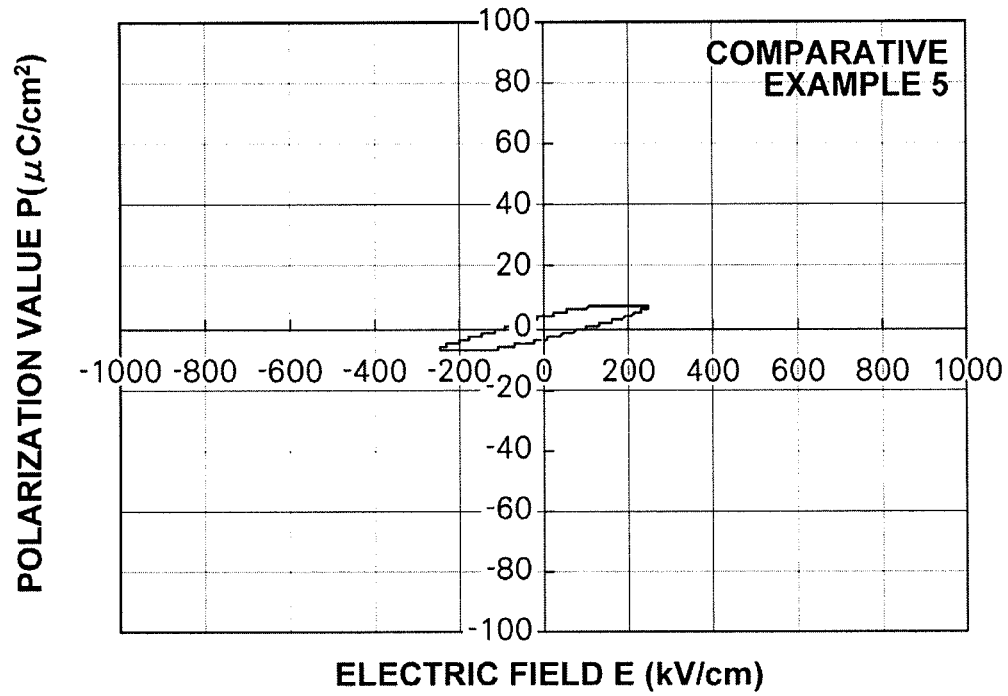
FIG. 13 shows P-E hysteresis characteristics of Comparative Example 5.

As in Examples 1, 2 and Comparative Examples 1 to 3, bipolar polarization-electric field characteristics (PE hysteresis characteristics) were measured, the results of which are shown in FIGS. 11 to 13. The residual polarization values Pr are shown below.

Example 5: Pr=29 µC/cm²
Example 6: Pr=27 µC/cm²
Comparative Example 5: Pr=3.2 µC/cm²

Example 7 and Comparative Example 6

Piezoelectric devices were obtained in the same manner as that of Examples 1, 2 and Comparative Examples 1 to 3 other than film forming conditions of perovskite oxide films. In Example 7 and Comparative Example 6, the film forming was performed under the same conditions other than target compositions, which are shown below.

Target Composition of Example 7: $Bi(Fe_{0.675}, Mn_{0.10}, C_{0.0225})O_3$

Target Composition of Comparative Example 6: $Bi(Fe_{0.75}, Co_{0.25})O_3$

Film Forming Conditions Common to Example 7 and Comparative Example 6

Figure 14:
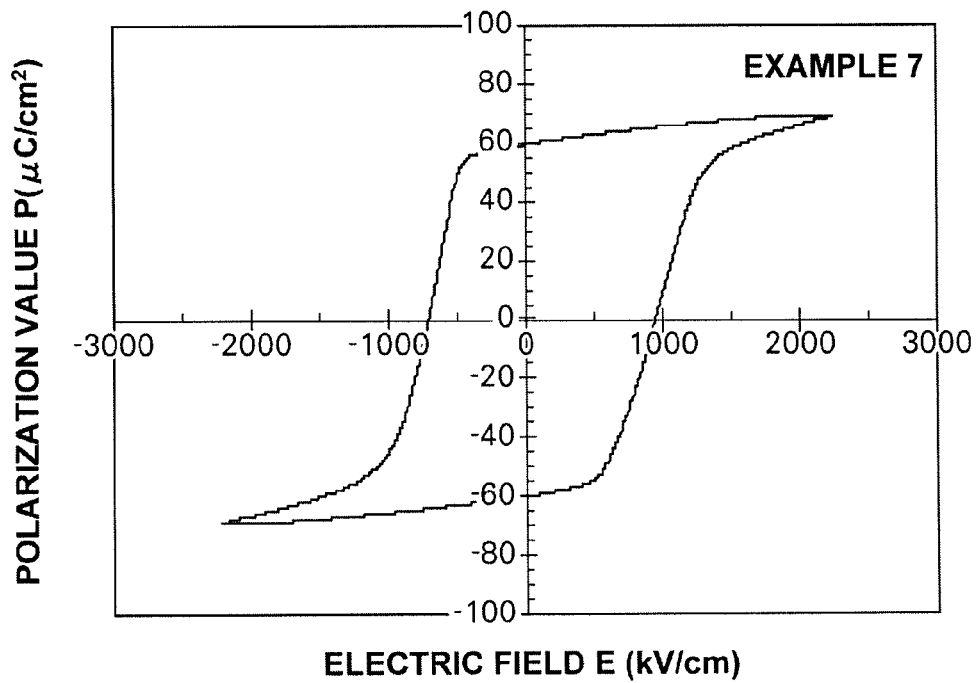
FIG. 14 shows P-E hysteresis characteristics of Example 7.

SRO/STO Substrate
Laser Power: 350 mJ
Laser Pulse Frequency: 5 Hz
Oxygen Partial Pressure: 6.66 Pa (50 mm Torr)
Distance between Substrate and Target: 50 mm
Substrate Temperature: 580° C.
Film Thickness: 300 to 400 nm
<XRD Measurements>
XRD measurements performed on the perovskite oxide obtained in each of the examples showed that each of the films was a perovskite single phase film with (100) preferred orientation.
<P-E Characteristics>
As in Examples 1, 2 and Comparative Examples 1 to 3, bipolar polarization-electric field characteristics (PE hysteresis characteristics) were measured. Favorable ferroelectricity was confirmed in Example 7 but not in Comparative Example 6. The results of Example 7 are shown in FIG. 14.

Example 8

Figure 15:
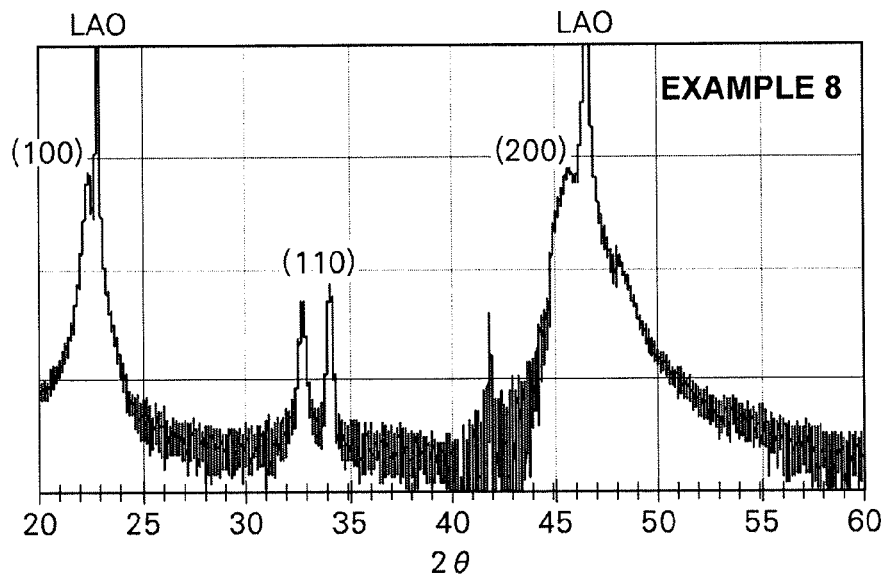
FIG. 15 shows an XRD spectrum of Example 8.

A (100) $SrRuO_3$ lower electrode was formed on the surface of a (100) $LaAlO_3$ single crystal substrate by PLD method with a thickness of 0.2 μm. Then, a perovskite oxide film was formed by PLD method under the following film forming conditions.
Film Forming Conditions:
  SRO/LAO Substrate
  Target Composition: $(Bi_{0.95}, La_{0.05})(Fe_{0.855}, Al_{0.095}, Mn_{0.05})O_3$
  Laser Power: 200 mJ
  Laser Pulse Frequency: 10 Hz
  Oxygen Partial Pressure: 6.66 Pa (50 mm Torr)
  Distance between Substrate and Target: 50 mm
  Substrate Temperature: 600° C.
  Film Thickness: 1.21 μm
<XRD Measurements>
XRD measurements performed on the perovskite oxide obtained showed that the film was a perovskite single phase film with (100) preferred orientation. The XRD spectrum is shown in FIG. 15.

Examples 9 to 13 and Comparative Examples 7, 8

Piezoelectric devices were obtained in the same manner as that of Examples 1, 2 and Comparative Examples 1 to 3 other than film forming conditions of perovskite oxide films. In Examples 9 to 13 and Comparative Examples 7, 8, the film forming was performed under the same conditions other than target compositions, which are shown below.
  Target Composition of Example 9: $Bi(Fe_{0.78}, Zn_{0.11}, Ti_{0.11})O_3$
  Target Composition of Example 10: $Bi(Fe_{0.75}, Zn_{0.1}, Ti_{0.1}, Mn_{0.05})O_3$
  Target Composition of Example 11: $Bi(Fe_{0.75}, Zn_{0.1}, Zr_{0.1}, Mn0.05)O_3$
  Target Composition of Example 12: $Bi(Fe_{0.75}, Zn_{0.133}, Nb_{0.067}, Mn_{0.05})O_3$
  Target Composition of Comparative Example 7 $Bi(Fe_{0.75}, Zn_{0.25})O_3$
  Target Composition of Example 13: $(Bi_{0.81}, Sn_{0.19})(Fe_{0.76}, Ti_{0.19}, Mn_{0.05})O_3$
  Target Composition of Comparative Example 8 $(Bi_{0.95}, Sn_{0.05})FeO_3$ Film Forming Conditions Common to Examples 9 to 13 and Comparative Examples 7, 8

SRO/STO Substrate
Laser Power: 350 mJ
Laser Pulse Frequency: 5 Hz
Oxygen Partial Pressure: 6.66 Pa (50 mm Torr)
Distance between Substrate and Target: 50 mm
Substrate Temperature: 580° C.
Film Thickness: 300 to 400 nm
With respect to each example, the dielectric constant was measured. Using impedance analyzer 4294A (Agilent Technologies), capacitances were measured in Cp-D mode by changing the frequency in the range from 1 kHz to 1 MHz, and dielectric constants were calculated for each example from the film thickness and electrode area. Measurement results at 1 kHz are shown below as representatives.
  Dielectric Constant of Example 9: 120
  Dielectric Constant of Example 10: 140
  Dielectric Constant of Example 11: 135
  Dielectric Constant of Example 12: 135
  Dielectric Constant of Comparative Example 7: 75
  Dielectric Constant of Example 13: 130
  Dielectric Constant of Comparative Example 8: 95
[Industrial Applicability]
The piezoelectric oxide of the present invention is preferably applied to actuators mounted on inkjet recording heads, magnetic read/write heads, MEMS (micro electromechanical systems) devices, micropumps, ultrasonic probes, and the like, and ferroelectric devices, such as ferroelectric memories and the like.
What is claimed is:
1. A perovskite oxide represented by a general expression (P) below, $$(A_a, B_b)(C_c, D_d, X_x)O_3 \qquad (P)$$

wherein conditions of reference symbols are as follows:
A: an A-site element, A=Bi, 0<a,
B: one or more types of A-site elements, $0 \leq b < 1.0$,
C: a B-site element, C=Fe, 0<c<1.0,
D: one or more types of B-site elements, 0<d<1.0, 0<b+d,
X: one or more types of B-site elements, the average valence of which is greater than the average valence of C and D in chemical formula, 0<x<1.0,
wherein (average valence of A-site in chemical formula)+ (average valence of B-site in chemical formula)>6.0,
O: oxygen, and
standard molar ratio among A-site elements, B-site elements, and oxygen is 1:1:3, but the molar ratio may deviate from the standard within a range in which a perovskite structure is possible, and wherein:
D includes at least one type of element selected from the group consisting of Al, Co, Sc, Ga, Y, In, Mn, Zn, Cr, and Ni; and
X includes at least one type of element selected from the group consisting of Si, Ti, Mn, Zr, Ge, Nb, W, Mo, Ta, Hf, and Sn.
2. The perovskite oxide of claim 1, wherein:
D includes at least one type of element selected from the group consisting of Al, Co, and Zn; and
X includes at least one type of element selected from the group consisting of Si, Ti, Mn, Nb, and Zr.

3. The perovskite oxide of claim 1, wherein the perovskite oxide has a composition of or near a morphotropic phase boundary.

4. An oxide composition, comprising the perovskite oxide of claim 1.

5. An oxide body, comprising the perovskite oxide of claim 1.

6. The oxide body of claim 5, wherein the oxide body is a film or a bulk ceramic body.

7. The oxide body of claim 5, wherein the oxide body shows a piezoelectric performance.

8. A piezoelectric device, comprising the oxide body of claim 7 and electrodes for applying an electric field to the oxide body.

9. A liquid discharge apparatus, comprising:
the piezoelectric device of claim 8; and
a liquid discharge member provided adjacent to the piezoelectric device, the liquid discharge member having a liquid storage chamber for storing a liquid and a liquid discharge opening for discharging the liquid from the liquid storage chamber to the outside according to the application of the electric field to the oxide body.

10. A perovskite oxide represented by a general expression (P) below, $$(A_a, B_b)(C_c, D_d, X_x)O_3 \quad (P)$$

wherein conditions of reference symbols are as follows:
A: an A-site element, A=Bi, 0<a,
B: one or more types of A-site elements, 0<b<1.0,
C: a B-site element, C=Fe, 0<c<1.0,
D: one or more types of B-site elements, 0≦d<1.0, 0<b+d,
X: one or more types of B-site elements, the average valence of which is greater than the average valence of C and D in chemical formula, 0<x<1.0,
wherein (average valence of A-site in chemical formula)+ (average valence of B-site in chemical formula)>6.0,
O: oxygen, and
standard molar ratio among A-site elements, B-site elements, and oxygen is 1:1:3, but the molar ratio may deviate from the standard within a range in which a perovskite structure is possible, and wherein:
B includes at least one type of elements selected from the group consisting of K, Ba, Sn, and a lanthanide element; and
X includes at least one type of element selected from the group consisting of Si, Ti, Mn, Zr, Ge, Nb, W, Mo, Ta, Hf, and Sn.

11. The perovskite oxide of claim 10, wherein:
B includes the lanthanide element; and
X includes at least one type of element selected from the group consisting of Si, Ti, Mn, and Nb.

12. The perovskite oxide of claim 11, wherein B includes at least one type of element selected from the group consisting of Sm, Nd, La, and Dy.

13. The perovskite oxide of claim 10, wherein:
B includes Ba and/or Sn; and
X includes at least one type of element selected from the group consisting of Si, Ti, Mn, and Nb.

14. The perovskite oxide of claim 13, wherein the perovskite oxide is represented by a general expression below.

(where, B' represents Ba and/or Sn, 0<α≦0.15).

15. The perovskite oxide of claim 10, wherein:
B includes K; and
X includes at least one type of element selected from the group consisting of Si, Ti, Mn, and Nb.

16. The perovskite oxide of claim 10, wherein the perovskite oxide has a composition of or near a morphotropic phase boundary.

17. An oxide composition, comprising the perovskite oxide of claim 10.

18. An oxide body, comprising the perovskite oxide of claim 10.

19. The oxide body of claim 18, wherein the oxide body is a film or a bulk ceramic body.

20. The oxide body of claim 18, wherein the oxide body shows a piezoelectric performance.

21. A piezoelectric device, comprising the oxide body of claim 20 and electrodes for applying an electric field to the oxide body.

22. A liquid discharge apparatus, comprising:
the piezoelectric device of claim 21; and
a liquid discharge member provided adjacent to the piezoelectric device, the liquid discharge member having a liquid storage chamber for storing a liquid and a liquid discharge opening for discharging the liquid from the liquid storage chamber to the outside according to the application of the electric field to the oxide body.

* * * * *